United States Patent
Kim et al.

(10) Patent No.: US 11,981,851 B2
(45) Date of Patent: May 14, 2024

(54) QUANTUM DOTS AND DEVICE INCLUDING THE SAME

(71) Applicant: SAMSUNG ELECTRONICS CO., LTD., Suwon-si (KR)

(72) Inventors: Sung Woo Kim, Hwaseong-si (KR); Jin A Kim, Suwon-si (KR); Tae Hyung Kim, Seoul (KR); Kun Su Park, Seongnam-si (KR); Yuho Won, Seoul (KR); Jeong Hee Lee, Seongnam-si (KR); Eun Joo Jang, Suwon-si (KR); Hyo Sook Jang, Suwon-si (KR); Yong Seok Han, Anyang-si (KR); Heejae Chung, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/054,687

(22) Filed: Nov. 11, 2022

(65) Prior Publication Data

US 2023/0071604 A1 Mar. 9, 2023

Related U.S. Application Data

(63) Continuation of application No. 17/007,179, filed on Aug. 31, 2020, now Pat. No. 11,499,098.

(30) Foreign Application Priority Data

Aug. 29, 2019 (KR) .................. 10-2019-0106890

(51) Int. Cl.
*C09K 11/88* (2006.01)
*B82Y 20/00* (2011.01)
(Continued)

(52) U.S. Cl.
CPC .......... *C09K 11/883* (2013.01); *H10K 50/115* (2023.02); *B82Y 20/00* (2013.01);
(Continued)

(58) Field of Classification Search
CPC ........................... C09K 11/883; H10K 50/115
See application file for complete search history.

(56) References Cited

U.S. PATENT DOCUMENTS 6,645,645 B1 11/2003 Adachi et al.
7,700,200 B2 4/2010 Vladimir et al.
(Continued)

FOREIGN PATENT DOCUMENTS

CN 107794044 A 3/2018
CN 108641720 A 10/2018
(Continued)

OTHER PUBLICATIONS

Aqiang Wang, et al., Bright, efficient, and color-stable violet ZnSe-based quantum dot light-emitting diodes, The Royal Society of Chemistry, Nanoscale, 2015, 7, 2951-2959.
(Continued)

*Primary Examiner* — C Melissa Koslow
(74) *Attorney, Agent, or Firm* — CANTOR COLBURN LLP

(57) ABSTRACT

A quantum dot including a core comprising a first semiconductor nanocrystal including a zinc chalcogenide and a semiconductor nanocrystal shell disposed on the surface of the core and comprising zinc, selenium, and sulfur. The quantum dot does not comprise cadmium, emits blue light, and may exhibit a digital diffraction pattern obtained by a Fast Fourier Transform of a transmission electron microscopic image including a (100) facet of a zinc blende structure. In an X-ray diffraction spectrum of the quantum dot, a ratio of a defect peak area with respect to a peak area
(Continued)

of a zinc blende crystal structure is less than about 0.8:1. A method of producing the quantum dot, and an electroluminescent device including the quantum dot are also disclosed.

19 Claims, 14 Drawing Sheets

(51) Int. Cl.
    *B82Y 30/00*     (2011.01)
    *B82Y 40/00*     (2011.01)
    *H10K 50/115*     (2023.01)

(52) U.S. Cl.
    CPC ............... *B82Y 30/00* (2013.01); *B82Y 40/00* (2013.01); *C01P 2002/01* (2013.01); *C01P 2002/74* (2013.01); *C01P 2004/30* (2013.01); *C01P 2004/64* (2013.01); *C01P 2004/80* (2013.01)

(56) References Cited

U.S. PATENT DOCUMENTS

| | | |
|---|---|---|
| 8,946,728 B2 | 2/2015 | Kim |
| 9,834,724 B2 | 12/2017 | Kim et al. |
| 10,074,770 B2 | 9/2018 | Park et al. |
| 10,559,712 B2 | 2/2020 | Park et al. |
| 10,590,340 B2 | 3/2020 | Jang et al. |
| 10,619,096 B2 | 4/2020 | Park et al. |
| 10,975,298 B2 | 4/2021 | Jang et al. |
| 11,011,672 B2 | 5/2021 | Park et al. |
| 11,142,685 B2 | 10/2021 | Won et al. |
| 11,193,062 B2 | 12/2021 | Park et al. |
| 11,312,901 B2 | 4/2022 | Jang et al. |
| 11,319,487 B2 | 5/2022 | Lee et al. |
| 11,355,583 B2 | 6/2022 | Kwon et al. |
| 11,365,348 B2 | 6/2022 | Park et al. |
| 11,505,740 B2 | 11/2022 | Won et al. |
| 11,566,345 B2 | 1/2023 | Kim et al. |
| 2005/0274944 A1 | 12/2005 | Jang et al. |
| 2008/0290797 A1 | 11/2008 | Park et al. |
| 2009/0039764 A1 | 2/2009 | Cho et al. |
| 2010/0108984 A1 | 5/2010 | Cho et al. |
| 2012/0032138 A1 | 2/2012 | Kim et al. |
| 2013/0277669 A1 | 10/2013 | Krebs et al. |
| 2014/0014896 A1 | 1/2014 | Chung et al. |
| 2015/0076494 A1 | 3/2015 | Pickett et al. |
| 2018/0094190 A1 | 4/2018 | Kim et al. |
| 2018/0179441 A1 | 6/2018 | Park et al. |
| 2018/0327665 A1 | 11/2018 | Lee et al. |
| 2019/0119569 A1 | 1/2019 | Pope |
| 2020/0083470 A1 | 3/2020 | Chung et al. |
| 2021/0183999 A1 | 6/2021 | Kwon et al. |
| 2022/0220379 A1 | 7/2022 | Lee et al. |
| 2022/0243125 A1 | 8/2022 | Jang et al. |
| 2023/0093467 A1 | 3/2023 | Kim et al. |
| 2023/0106180 A1 | 4/2023 | Won et al. |

FOREIGN PATENT DOCUMENTS

| | | |
|---|---|---|
| EP | 2448017 A2 | 5/2012 |
| EP | 2448017 A3 | 5/2014 |
| EP | 3401380 A1 | 11/2018 |
| EP | 3613826 A1 | 2/2020 |
| KR | 20150121355 A | 10/2015 |
| WO | 2012041847 A1 | 4/2012 |
| WO | 2015036762 | 3/2015 |
| WO | 2019072884 A1 | 4/2019 |

OTHER PUBLICATIONS

Christian Ippen, et al., High efficiency heavy metal free QD-LEDs for next generation displays, J Soc Inf Display. 2019;1-9.
Extended European Search Report dated Nov. 18, 2020, of the corresponding European Patent Application No. 20193705.9.
Huaibin Shen, et al., High-Effi cient Deep-Blue Light-Emitting Diodes by Using High Quality . . . , Adv. Funct. Mater. 2014, 24, 2367-2373.
Lishuang Wang, et al., Blue Quantum Dot Light-Emitting Diodes with HighElectroluminescent Efficiency, ACS Appl. Mater. Interfaces, 9, 38755-38760 (2017).
Wenyu Ji, et al., Cadmium-free quantum dot light emitting devices: energy-transfer realizing pure blue emission, Jan. 1, 2013 / vol. 38, No. 1 / Optics Letters, pp. 7-9.
Xingliang Dai, et al., Solution-processed, high-performance light-emitting diodes based on quantum dots, 96, Nature, vol. 515, Nov. 6, 2014, 15 pp.
Office Action dated Aug. 14, 2023, of the corresponding Chinese Patent Application No. 202010895937.5, 13 pp.

QUANTUM DOTS AND DEVICE INCLUDING THE SAME

CROSS-REFERENCE TO RELATED APPLICATION

This application is a continuation application and claims priority to U.S. patent application serial No. 17/007,179, filed Aug. 31, 2020, now U.S. Pat. No. 11,499,098, which in tern claims priority to Korean Patent Application No. 10-2019-0106890 filed in the Korean Intellectual Property Office on Aug. 29, 2019, and all benefits accruing therefrom under 35 U.S.C. § 119, 120, the contents of which in their entirety are herein incorporated by reference.

BACKGROUND

1. Field

Quantum dots, quantum dot solutions, and an electroluminescent device that include the quantum dots, or are manufactured with the quantum dot solutions, are disclosed.

2. Description of the Related Art

Semiconductor nanocrystal particles also called as quantum dots are crystalline materials having sizes of several nanometers. Such semiconductor nanocrystal particles have such small sizes that they have a large surface area per unit volume and exhibit quantum confinement effects, and thus have different properties from the characteristics of bulk materials having the same composition. Quantum dots may absorb light from an excitation source to be excited, and may emit energy.

SUMMARY

An embodiment provides an environmentally friendly quantum dot that does not include a harmful heavy metal (e.g., cadmium), and which exhibits improved optical (e.g., photoluminescent or electroluminescent) properties.

Another embodiment provides a method of producing the quantum dots.

Another embodiment provides a light emitting device including the quantum dots.

In an embodiment, a quantum dot does not include cadmium and emits blue light (e.g., on excitation). The quantum dot includes a core including a first semiconductor nanocrystal including a zinc chalcogenide, and a semiconductor nanocrystal shell disposed on the surface of the core, the shell including zinc, selenium, and sulfur. In an X-ray diffraction spectrum of the quantum dot, a ratio of a defect peak area with respect to a peak area of a zinc blende crystal structure is less than about 0.8:1.

A digital diffraction pattern obtained by a Fast Fourier Transform of a transmission electron microscopy (e.g., high resolution TEM or high resolution Scanning TEM) image (hereinafter, also referred to as "FFT-TEM"), for example, with a [001] zone axis or with a predetermined zone axis, of the quantum dot may include (or consist of) a (100) facet of a zinc blende structure.

A maximum luminescent peak wavelength of the quantum dot may be greater than or equal to about 430 nanometers (nm).

A maximum luminescent peak wavelength of the quantum dot may be greater than or equal to about 440 nm, greater than or equal to about 450 nm, or greater than or equal to about 451 nm.

A maximum luminescent peak wavelength of the quantum dot may be less than or equal to about 480 nm.

A maximum luminescent peak wavelength of the quantum dot may be less than or equal to about 470 nm.

A maximum luminescent peak of the quantum dot may have a full width at half maximum of less than or equal to about 25 nm.

A maximum luminescent peak of the quantum dot may have a full width at half maximum of less than or equal to about 20 nm.

The zinc chalcogenide may include zinc and selenium, and optionally tellurium.

In the quantum dot, a mole ratio of tellurium relative to selenium (Te:Se) may be less than or equal to about 0.1:1 or less than or equal to about 0.05:1.

In the quantum dot, a mole ratio of tellurium relative to selenium (Te:Se) may be less than or equal to about 0.03:1.

In the quantum dot, a mole ratio of sulfur relative to selenium (S:Se) may be less than or equal to about 0.8:1.

In the quantum dot, a mole ratio of selenium relative to zinc may be less than or equal to about 0.7:1.

The semiconductor nanocrystal shell may have a composition that varies in a radial direction.

The semiconductor nanocrystal shell may include a first shell layer disposed directly on the core and an outer shell layer disposed on the first shell layer, wherein the first shell layer may include a second semiconductor nanocrystal that has a composition different from the first semiconductor nanocrystal and the outer shell layer may include a third semiconductor nanocrystal having a different composition from the second semiconductor nanocrystal.

The second semiconductor nanocrystal may include zinc and selenium, and optionally at least one of tellurium or sulfur (i.e., tellurium, sulfur, or tellurium and sulfur).

The third semiconductor nanocrystal may include zinc and sulfur.

The outer shell layer may be an outermost layer of the quantum dot.

The first semiconductor nanocrystal may include $ZnTe_xSe_{1-x}$, wherein, x is greater than 0 and less than or equal to about 0.05.

The second semiconductor nanocrystal may include zinc and selenium (e.g., a zinc selenide).

The third semiconductor nanocrystal may include zinc and sulfur (e.g., a zinc sulfide).

The first semiconductor nanocrystal may include $ZnTe_xSe_{1-x}$, wherein, x is greater than 0 and less than or equal to about 0.05, the second semiconductor nanocrystal comprises zinc and selenium, and the third semiconductor nanocrystal comprises zinc and sulfur.

The third semiconductor nanocrystal may not include selenium.

The first semiconductor nanocrystal may have an energy bandgap that is less than an energy bandgap of the second semiconductor nanocrystal, and the second semiconductor nanocrystal may have an energy bandgap that is less than that of the third semiconductor nanocrystal.

The quantum dot may include a halogen.

The halogen may include fluorine, and optionally chlorine.

In an X-ray diffraction spectrum of the quantum dot, a ratio of a defect peak area with respect to a peak area of a zinc blende crystal structure is less than about 0.5:1.

In an X-ray diffraction spectrum of the quantum dot, a ratio of a defect peak area with respect to a peak area of a zinc blende crystal structure is less than about 0.4:1.

In an X-ray diffraction spectrum of the quantum dot, a ratio of a defect peak area with respect to a peak area of a zinc blende crystal structure is less than about 0.3:1.

In an X-ray diffraction spectrum of the quantum dot, a ratio of a defect peak area with respect to a peak area of a zinc blende crystal structure is less than about 0.2:1.

In an X-ray diffraction spectrum of the quantum dot, a ratio of a defect peak area with respect to a peak area of a zinc blende crystal structure is less than about 0.1:1.

In an X-ray diffraction spectrum of the quantum dot, a ratio of a defect peak area with respect to a peak area of a zinc blende crystal structure is less than about 0.05:1.

The quantum dot may not exhibit a diffuse scattering in a diffraction pattern obtained by FFT-TEM.

A digital diffraction pattern obtained by FFT-TEM (e.g., with a [001] zone axis) of the quantum dot may consist of a (100) facet of a zinc blende structure.

The quantum dot may be one of (e.g., may constitute) a quantum dot population that has an average particle size (e.g., a diameter or an equivalent diameter determined by a TEM analysis) of less than or equal to about 18 nm, or less than or equal to about 15 nm.

The quantum dot population may have an average circularity of less than about 0.8.

The quantum dot population may have an average solidity of greater than about 0.9.

The quantum dot (or the core) may not include indium phosphide.

The quantum dot (or the core) may not include a Group III-V compound (e.g., including indium phosphide).

The quantum dot may have a (relative or absolute) quantum efficiency of greater than or equal to about 80%.

The quantum dot may further include an organic ligand (e.g., on a surface thereof or bound to a surface thereof) and the organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, $R_2POOH$, wherein, R and R' independently include C1 to C40 substituted or unsubstituted aliphatic hydrocarbon group, C6 to C40 substituted or unsubstituted aromatic hydrocarbon group, or a combination thereof, or a combination thereof.

In another embodiment, a method of producing the aforementioned quantum dot includes:

providing a core including a first semiconductor nanocrystal including a zinc chalcogenide;

reacting a zinc precursor, a selenium precursor, and a sulfur precursor, in a reaction medium (e.g., including an organic solvent) in the presence of an organic ligand, a fluorine compound, and optionally a chlorine compound, to form the semiconductor nanocrystal shell.

Per 10 mL of a solution including the core and having an optical density of 0.54 at a first absorption peak wavelength, the fluorine compound may be used in an amount of greater than or equal to about 0.05 mmol, or greater than or equal to about 0.1 mmol.

The amount of the fluorine compound as used may be greater than or equal to about 0.15 mmol.

The amount of the fluorine compound as used may be greater than or equal to about 1 mmol.

The amount of the fluorine compound as used may be less than or equal to about 3 mmol.

The amount of the fluorine compound as used may be less than or equal to about 2 mmol.

The amount of the fluorine compound may be less than or equal to about 1.5 mmol.

The fluorine compound may include a fluorine inorganic salt, hydrofluoric acid, or a combination thereof.

The fluorine inorganic salt may include a metal fluoride.

During the formation of the semiconductor nanocrystal shell, a chlorine compound may be injected to the reaction medium.

The chlorine compound may include a metal chloride, a hydrochloric acid, or a combination thereof.

In an embodiment, an electroluminescent device includes a first electrode with a surface, and a second electrode with a surface that faces the surface of the first electrode, and a quantum dot emission layer including quantum dots and disposed between the first electrode and the second electrode, wherein the quantum dots include the aforementioned quantum dot.

The electroluminescent device may further include a charge auxiliary layer between the first electrode and the quantum dot emission layer, between the second electrode and the quantum dot emission layer, or between the first electrode and the quantum dot emission layer and between the second electrode and the quantum dot emission layer.

The electroluminescent device may be configured to emit blue light (e.g., by application of a voltage).

The charge auxiliary layer may include a charge injection layer, a charge transport layer, or a combination thereof.

A maximum peak wavelength of the blue light may be greater than or equal to about 445 nm, or greater than or equal to about 450 nm, and less than or equal to about 480 nm, e.g., less than or equal to about 470 nm or less than or equal to about 460 nm. A maximum emission peak of the blue light may have an FWHM of about less than or equal to about 20 nm.

A peak external quantum efficiency of the electroluminescent device may be greater than or equal to about 7.7%.

The electroluminescent device may have T50 of greater than or equal to about 25 hours.

Another embodiment provides a display device including the aforementioned electroluminescent device.

The cadmium-free quantum dot of an embodiment may exhibit improved optical (e.g., photoluminescent or electroluminescent) properties or characteristics, and is environmentally friendly as it may not include a harmful heavy metal, e.g., lead, cadmium, mercury, or a combination thereof. The quantum dot may be applied to various display devices, biolabeling (biosensor, bioimaging), a photodetector, a solar cell, a hybrid composite, or the like.

The electroluminescent device of an embodiment may include the cadmium free quantum dot of an embodiment and still realize improved display quality as applied to a display device.

DETAILED DESCRIPTION

Figure 1:
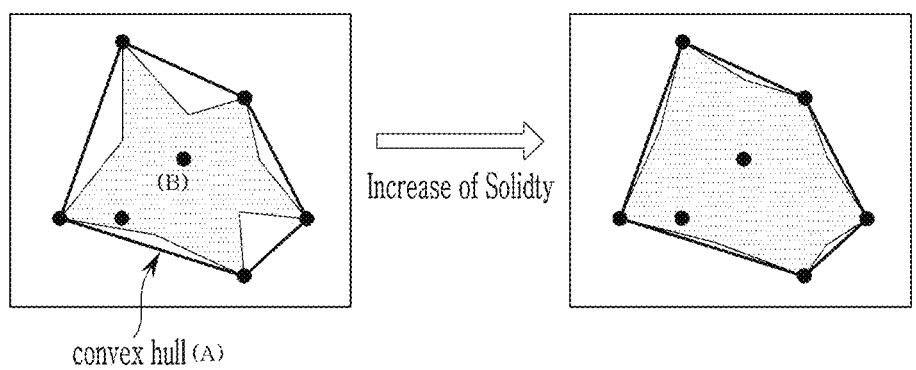
FIG. 1 is a schematic illustration of the term "solidity," that can be determined by dividing "a measured area" with "a convex hull area".

Advantages and characteristics of this disclosure, and a method for achieving the same, will become evident referring to the following example embodiments together with the attached drawings. However, the embodiments should not be construed as being limited to the embodiments set forth herein. Rather, these embodiments are provided so that this disclosure will be thorough and complete, and will fully convey the scope of the invention to those skilled in the art.

If not defined otherwise, all terms (including technical and scientific terms) in the specification may be defined as commonly understood by one skilled in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise" and variations such as "comprises" or "comprising" or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Further, the singular includes the plural unless mentioned otherwise.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. In order to clearly illustrate the embodiments in the drawings, some portions not really relevant to the explanation may be omitted.

It will be understood that, although the terms "first," "second," "third" etc. may be used herein to describe various elements, components, regions, layers and/or sections, these elements, components, regions, layers, and/or sections should not be limited by these terms. These terms are only used to distinguish one element, component, region, layer or section from another element, component, region, layer, or section. Thus, "a first element," "component," "region," "layer" or "section" discussed below could be termed a second element, component, region, layer, or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within 10% or 5% of the stated value.

As used herein, the expression that "not including cadmium (or other harmful heavy metal)" refers to the case where a concentration of the cadmium (or the harmful heavy metal) may be less than or equal to about 100 ppm, less than or equal to about 50 ppm, less than or equal to about 10 ppm, or almost zero. In an embodiment, substantially no amount of the cadmium (or other heavy metal) may be present or, if present, an amount of the cadmium (or other heavy metal) may be less than or equal to a detection limit or as an impurity level of a given analysis tool (e.g., an inductively coupled plasma atomic emission spectroscopy).

As used herein, the term a work function, or a highest occupied molecular orbital ("HOMO") or a lowest unoccupied molecular orbital (LUMO) energy level is expressed as an absolute value from a vacuum. If a work function, a HOMO energy level or a LUMO energy level is said to be 'deep,' 'high' or 'large,' the work function, the HOMO energy level, or the LUMO energy level has a large absolute value relative to '0 eV,' i.e., the energy level of a vacuum. In contrast, if the work function, the HOMO energy level, or the LUMO energy level is said to be 'shallow,' 'low,' or 'small,' the work function, the HOMO energy level, or the LUMO energy level has a small absolute value from '0 eV,' i.e., the energy level of a vacuum.

As used herein, the word "Group" refers to a group in the periodic table of the elements.

As used herein, the term "Group III" refers to Group IIIA and Group IIIB of the Periodic Table of the elements, and examples of Group III metals may include Al, In, Ga, and TI, but are not limited thereto.

As used herein, the term "Group V" may refer to Group VA of the Periodic Table of the elements, and examples may include nitrogen, phosphorus, arsenic, antimony, and bismuth, but are not limited thereto.

As used herein, when a definition is not otherwise provided, "substituted" refers to the case where in a compound or a functional group, hydrogen is replaced by a substituent selected from a C1 to C30 an alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, C3 to C40 heteroaryl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxylic acid group or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

The wording "hydrocarbon" group may refer to a group including carbon and hydrogen (e.g., an aliphatic such as an alkyl, an alkenyl, an alkynyl, or an aromatic such as an aryl group). The hydrocarbon group may be a group having a valence of at least one that is formed by elimination of at least one hydrogen atom therefrom (e.g., an alkane, an alkene, an alkyne, or an arene group). At least one methylene in the aliphatic group may be replaced with an oxide moiety, a carbonyl moiety, an ester moiety, —NH—, or a combination thereof. Unless indicated otherwise, an aliphatic group (e.g., alkyl, alkenyl, alkynyl, or aryl) may have any number of carbon atoms, e.g., from 1 to 60 carbon atoms, or 2 to 32 carbon atoms, or 3 to 24 carbon atoms, or 4 to 12 carbon atoms.

As used herein, when a definition is not otherwise provided, "alkyl" refers to a linear or branched saturated monovalent hydrocarbon group (methyl, ethyl, hexyl, etc.).

As used herein, when a definition is not otherwise provided, "alkenyl" refers to a linear or branched monovalent hydrocarbon group having one or more carbon-carbon double bond.

As used herein, when a definition is not otherwise provided, "alkynyl" refers to a linear or branched monovalent hydrocarbon group having one or more carbon-carbon triple bond.

As used herein, when a definition is not otherwise provided, "aryl" may refer to a group formed by elimination of at least one hydrogen atom from an aromatic hydrocarbon (e.g., a phenyl or naphthyl group).

As used herein, "hetero" refers to one including one or more (e.g., 1 to 3) heteroatom of N, O, S, Si, P, or a combination thereof.

As used herein, when a definition is not otherwise provided, "alkoxy" refers to an alkyl group that is linked via an oxygen (i.e., alkyl-O—), for example methoxy, ethoxy, and sec-butyloxy groups.

As used herein, when a definition is not otherwise provided, an "amine" group has the general formula —NRR, wherein each R is independently hydrogen, a C1-C12 alkyl group, a C7-C20 alkylaryl group, a C7-C20 arylalkylene group, or a C6-C18 aryl group.

Quantum dots (at times, also referred to as semiconductor nanocrystal particles) may absorb light from an excitation source and may emit light corresponding to an energy bandgap thereof. The energy bandgap of the quantum dot may be changed depending on a size and/or a composition of the quantum dot. For example, as the size of the quantum dot increases, the quantum dot may have a narrower energy bandgap and may exhibit an increased light emitting wavelength. Quantum dots may be used as a light emitting material in various fields such as a display device, an energy device, or a bio light emitting device.

Cadmium-free quantum dots, i.e., quantum dots not including cadmium (and optionally not including lead, mercury, or a combination thereof) may have an electroluminescent property and stability that are inferior to a quantum dot that includes such harmful heavy metals as a main component. The cadmium as well as the other metals listed above may raise environmental and/or health issues and are restricted elements defined under Restriction of Hazardous Substances Directive (RoHS) in many countries. Accordingly, developing a cadmium-free quantum dot capable of exhibiting desired electroluminescent properties (such as an emission wavelength of blue light, a narrower FWHM, increased EQE, or increased brightness) and an electroluminescent device including the same remains a challenging technical task.

Previous InP-based, cadmium-free quantum dots can emit blue light, however, the quantum dots exhibit a relatively wide (or large) FWHM, and many have relatively low efficiency. The InP based, cadmium free quantum dots can include a relatively strong covalent-bonding property in a crystal structure, and thus, they are likely to have a lower atmospheric (oxygen or moisture) stability and/or photostability. A zinc chalcogenide (for example, ZnSe or ZnTe$_x$Se$_{1-x}$) may exhibit a relatively strong ionic bonding property in a crystal structure, and thus, it is believed that a core-shell quantum dot including a zinc chalcogenide core may realize enhanced optical (photoluminescent or electroluminescent) properties or characteristics (e.g., increased quantum efficiency). However, according to the researches of the present inventors, for a zinc chalcogenide-based quantum dot, an increased amount of tellurium may be required to achieve a pure blue light, which may also have a substantially adverse effect on optical properties (e.g., an FWHM) of the quantum dot. The present inventors have also found that an increase in an amount of chalcogen element (e.g., tellurium) in the core may significantly reduce atmospheric stability of a quantum dot and may cause additional technical issues with shell formation (e.g., passivation of core surface). In sum, controlling the composition of the ZnTeSe based core for achieving a desired emission of blue light may be related with the occurrence of the internal oxidation of the chalcogen element (e.g. selenium and tellurium) and a defect in a crystal lattice or surface thereof may occur during the growth of the nanocrystal structure, thus it may be difficult to ensure desired properties and desired shape control for the final quantum dot The quantum dot(s) according to an embodiment is (are) configured to emit blue light (e.g., emit(s) blue light on excitation), does not include cadmium, and may exhibit improved optical properties (e.g., quantum efficiency and an FWHM). Moreover, in another embodiment, the quantum dot may not include lead, mercury, or a combination thereof, as well as not including cadmium. The quantum dot may include a core including a first semiconductor nanocrystal including a zinc chalcogenide, and a semiconductor nanocrystal shell disposed on the core and comprising zinc, selenium, and sulfur.

The maximum peak wavelength of the blue light (e.g., a maximum luminescent peak wavelength of the quantum dot) may be greater than or equal to about 430 nm, greater than or equal to about 440 nm, greater than or equal to about 445 nm, greater than or equal to about 450 nm, or greater than or equal to about 455 nm and less than or equal to about 480 nm, less than or equal to about 475 nm, less than or equal to about 470 nm, less than or equal to about 465 nm, less than or equal to about 460 nm, or less than or equal to about 455 nm. The blue light may have a maximum emission peak wavelength of from about 450 nm to 470 nm (or to 465 nm, or to 460 nm).

The quantum dots tend to have a very large ratio of surface to particle size (or volume), and thus, their surface properties may have a substantial effect on luminous properties (e.g., quantum efficiency or an FWHM) of the quantum dot. The zinc chalcogenide based core/shell quantum dot may have various faces such as (100) face, (110) face, (111) face, and (101) face in terms of crystal facet, and these crystal facets may each exhibit different surface properties. In an embodiment, the (110) face may have a non-polar stoichiometric facet including the Zn and the Se and may have a low surface energy and be relatively stable. The (100) face and the (111) face may have a zinc rich face and a polar and non-stoichiometric facet having a relatively high surface energy. Without wishing to be bound by any theory, these facets may have a Zn-oleate or a halide ion passivation.

Without wishing to be bound by any theory, it is also believed that the facets included in the quantum dot may have surface energies that are the same as or different from one another. During the colloidal synthesis of the quantum dot (e.g., the core or the shell), it may not be easy to grow a desired facet, and thus, quantum dots with many facets may grow at the same time. The present inventors have found that the simultaneous growth of the many different facets may result in stacking faults in the crystal structure of the formed quantum dot (e.g., internal lattice defect). In addition, it is believed that the quantum dot based on the zinc chalcogenide may tend to suffer internal oxidation of the selenium and tellurium. The presence of surface defects and the oxidation of the element of the quantum dot may have adverse effects on optical properties (e.g., the luminous efficiency and an FWHM of the emission peak) of the quantum dot.

Quite surprisingly, the present inventors have found that through the adoption of a synthesis method as described below, crystal growth of a nanocrystal may be accomplished in a controlled manner, for example, for the formation of a nanocrystal having a desired facet predominantly (e.g., having a predominant (100) facet), and thus, the quantum dots as a whole may exhibit a controlled shape. In addition, the present inventors have found that a quantum dot having the controlled crystal facet and the controlled shape may emit blue light with improved quantum efficiency and relatively, reduced FWHM. Without wishing to be bound by any theory, in the method as described below, a halogen compound (e.g., a hydrofluoric acid or a metal fluoride, and optionally a hydrochloric acid and/or a metal chloride), may induce or direct crystal growth of the quantum dot to a specific crystal facet and may minimize the occurrence of stacking fault defects that may otherwise occur by the growth of quantum dots having many (uncontrolled) crystal facets, and occurrence of trap states on a surface of the quantum dot may also be suppressed.

Thus, as determined by an X-ray diffraction analysis of the quantum dot, a ratio of defect peak area with respect to a peak area of zinc blende crystal structure is less than or equal to about 0.8:1. The ratio of defect peak area with respect to a peak area of zinc blende crystal structure may be less than or equal to about 0.7:1.

As used herein, the defect peak refers to peaks other than the peaks at 2-theta that can be assigned to the zinc blende crystal in an X-ray diffraction spectroscopy analysis (hereinafter, a zinc blende peak). In the X-ray diffraction spectroscopy analysis, the presence of the zinc blende peaks (e.g., XRD (111) peak and the defect peaks can be determined by a peak deconvolution of the X-ray diffraction spectrum, which may be carried out by a commercially available computer software (e.g., having trade name of "Origin" from Originlab Korea Corporation). The peak deconvolution is a work of separating peaks overlapped with each other and extracting the information about the hidden peaks.

As determined by an X-ray diffraction spectroscopy analysis, a ratio of a defect peak area with respect to the zinc blende crystal peak area may be less than or equal to about 0.65:1, less than or equal to about 0.6:1, less than or equal to about 0.55:1, less than or equal to about 0.5:1, less than or equal to about 0.45:1, less than or equal to about 0.4:1, less than or equal to about 0.35:1, less than or equal to about 0.3:1, less than or equal to about 0.25:1, less than or equal to about 0.2:1, less than or equal to about 0.15:1, less than or equal to about 0.1:1, less than or equal to about 0.09:1, less than or equal to about 0.08:1, less than or equal to about 0.07:1, less than or equal to about 0.06:1, less than or equal to about 0.05:1, less than or equal to about 0.04:1, less than or equal to about 0.03:1, or less than or equal to about 0.02:1.

In an embodiment, the quantum dots may have a digital diffraction pattern as obtained by FFT-TEM. The digital diffraction pattern of the quantum dot may be consistent with (or may evidence the presence of) a predominant (100) facet of zinc blende structure (for example, with [001] zone axis).

As used herein, the wording "digital (diffraction) pattern" refers to a spot pattern including a regular arrangement of spots. Unlike a ring diffraction pattern, the digital diffraction pattern includes a regular arrangement of spots optionally having a center bright spot and may be observed in case of a single crystal within the illumination area. In the spot pattern, spot brightness may relate to the structure factor and spot position may relate to the d-spacing. As observed with a predetermined zone axis, the quantum dot of the embodiment may have a single crystal. The quantum dot of the embodiment may exhibit a digital diffraction pattern as obtained by a Fast Fourier Transform of a high resolution transmission electron microscopic image of the quantum dot. The digital diffraction pattern of the quantum dot may include (or may consist of) a diffraction pattern of a (100) facet of a zinc blende crystal structure. For a quantum dot, the diffraction pattern obtained by FFT-TEM may indicate a degree of diffuse diffraction caused by the presence of the defects, and in case of the quantum dot of the embodiment, the diffraction pattern of the FFT may not show diffuse diffraction.

By the controlled crystal growth, the quantum dots of the embodiment may have more uniform particle shape. Thus, in an embodiment, the quantum dot(s) of the embodiment may have improved shape parameters (e.g., solidity, circularity, or the like). The terms "solidity" and "circularity" is well understood by a person of ordinary skill, and are further described in greater below.

A size (or an average particle size) of the quantum dot(s) may be greater than or equal to about 5 nm, for example, greater than or equal to about 10 nm, greater than or equal to about 11 nm, or greater than or equal to about 12 nm. As used herein, the size of the quantum dot may refer to a diameter or an equivalent diameter obtained from a two-dimensional image of an electron microscopy analysis (e.g., under an assumption of a circle). As used herein, the particle size of the quantum dot may refer to an average (e.g., mean) value. The particle size of the quantum dot or the average particle size of the quantum dot may be less than or equal to about 50 nm, less than or equal to about 45 nm, less than or equal to about 40 nm, less than or equal to about 35 nm, less than or equal to about 30 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, or less than or equal to about 14 nm.

In an embodiment, the quantum dot(s) may have a circularity (or an average circularity) of less than about 0.8, for example, less than or equal to about 0.79, less than or equal to about 0.78, less than or equal to about 0.77, less than or equal to about 0.76, or less than or equal to about 0.75. As used herein, the circularity may be determined by using a two dimensional image obtained by an electron microscopy analysis and using the following equation referring to image J user guide (v 1.46r):

$$4\pi \times \{[Area]/[Perimeter]^2)\}$$

The circularity may be 1 for a perfect circle and as the circularity is closer to zero (0), a given shape is an increasingly elongated shape.

In an embodiment, the quantum dots may have a solidity (or an average solidity) of greater than or equal to about 0.9, greater than or equal to about 0.91, greater than or equal to about 0.92, greater than or equal to about 0.93, greater than or equal to about 0.94, or greater than or equal to about 0.95.

As used herein, the term "solidity" refers to a ratio of an area (B) of a two dimensional area of a quantum dot with respect to an area (A) of a convex hull. The convex hull may be defined as the smallest convex set of points in which a set of all points constituting a two dimensional image of a given quantum dot obtained by an electron microscopic analysis is depicted as in FIG. 1. The solidity may be measured by using an image (a two dimensional image) obtained from an electron microscopic analysis (e.g., a transmission electron microscopy analysis) and an image analysis program such as "image J".

In an embodiment, a predominant crystal facet may be present in a surface of the quantum dot, and thus a surface property of the quantum dot may become more uniform (e.g., being a metal rich or an organic material rich).

In the quantum dot (or the core of the quantum dot) of the embodiment, the zinc chalcogenide (or the first semiconductor nanocrystal) may include zinc, selenium, and optionally tellurium. The core or the quantum dot may not include manganese, copper, or a combination thereof.

In a quantum dot of an embodiment, the zinc chalcogenide (or the first semiconductor nanocrystal) may consist of zinc and selenium, and optionally tellurium. A size (or an average size) of the core may be greater than or equal to about 2 nm, greater than or equal to about 3 nm, or greater than or equal to about 4 nm. A size (or an average size) of the core may be less than or equal to about 6 nm, or less than or equal to about 5 nm. The first semiconductor nanocrystal may include $ZnTe_xSe_{1-x}$ (wherein x is greater than 0 and less than 0.05, or less than 0.04, or less than 0.03).

The semiconductor nanocrystal shell includes zinc (Zn), selenium (Se), and sulfur (S). The shell may be a multi-layered shell including a plurality of layers. In the plurality of layers for the shell, adjacent layers may have semiconductor nanocrystal material of different compositions. The multi-layered shell may include a first shell layer disposed directly on the core and an outer layer (e.g., a second layer) disposed on or over the first layer. The first shell layer may include a second semiconductor nanocrystal that is different from the first semiconductor nanocrystal. The outer shell layer (e.g., the second layer) may include a third semiconductor nanocrystal having a composition different from the second semiconductor nanocrystal. The outer shell layer (e.g., the second layer) may be the outermost layer of the quantum dot.

The second semiconductor nanocrystal may include zinc, selenium, and optionally sulfur. The second semiconductor nanocrystal may not include sulfur. The third semiconductor nanocrystal may include zinc and sulfur. The third semiconductor nanocrystal may not include selenium.

In the shell or the multi-layered shell, each of the layers may include a gradient composition varying in a direction of a radius, e.g., a radial direction from the core toward an outermost surface layer of the quantum dot. In an embodiment, an amount of the sulfur in the semiconductor nanocrystal shell layer may increase toward a surface of the quantum dot. For example, in the shell, the amount of the sulfur may increase in a direction away from the core, e.g., in a radial direction from the core toward an outermost surface of the quantum dot.

In the quantum dot of the embodiment, the first semiconductor nanocrystal may include $ZnTe_xSe_{1-x}$ (wherein x is greater than 0 and less than or equal to about 0.05, less than or equal to about 0.04, or less than or equal to about 0.03), the second semiconductor nanocrystal may include a zinc selenide (ZnSe), and the third semiconductor nanocrystal may include a zinc sulfide (ZnS) and not include selenium. In an embodiment, an energy bandgap of the first semiconductor nanocrystal may be less than that of the semiconductor nanocrystal and, an energy bandgap of the second semiconductor nanocrystal may be less than that of the third semiconductor nanocrystal.

The quantum dot may have a mole ratio of tellurium with respect to selenium (Te:Se) (e.g., measured by inductively coupled plasma-atomic emission spectroscopy (ICP-AES)) that is less than or equal to about 0.1:1, less than or equal to about 0.08:1, less than or equal to about 0.07:1, less than or equal to about 0.06:1, less than or equal to about 0.05:1, less than or equal to about 0.045:1, less than or equal to about 0.04:1, less than or equal to about 0.035:1, less than or equal to about 0.03:1, less than or equal to about 0.025:1, less than or equal to about 0.02:1, less than or equal to about 0.015:1, less than or equal to about 0.01:1, less than or equal to about 0.009:1, less than or equal to about 0.008:1, less than or equal to about 0.007:1, less than or equal to about 0.006:1, less than or equal to about 0.005:1.

The mole ratio of the tellurium to the selenium may be greater than or equal to about 0.0001:1, greater than or equal to about 0.00015:1, greater than or equal to about 0.0002:1, greater than or equal to about 0.00025:1, greater than or equal to about 0.0003:1, greater than or equal to about 0.00035:1, greater than or equal to about 0.0004:1, greater than or equal to about 0.00045:1, greater than or equal to about 0.0005:1, greater than or equal to about 0.00055:1, greater than or equal to about 0.006:1, greater than or equal to about 0.00065:1, greater than or equal to about 0.0007:1, greater than or equal to about 0.00075:1, greater than or equal to about 0.0008:1, greater than or equal to about 0.00085:1, greater than or equal to about 0.0009:1, greater than or equal to about 0.00095:1, greater than or equal to about 0.001:1, greater than or equal to about 0.0015:1, greater than or equal to about 0.002:1, greater than or equal to about 0.0025:1, greater than or equal to about 0.003:1, greater than or equal to about 0.0035:1, greater than or equal to about 0.004, or greater than or equal to about 0.0045:1.

The mole ratio of the tellurium to the selenium may be from about 0.004:1 to about 0.01:1. The mole ratio of the tellurium to the selenium may be about 0.0002:1 to about 0.02:1. The mole ratio of the tellurium to the selenium may be about 0.0003:1 to about 0.03:1.

In the quantum dot, a mole ratio of the tellurium with respect to the zinc (Te:Zn) (e.g., determined by an inductively coupled plasma-atomic emission spectroscopy) may be less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, less than or equal to about 0.010:1, less than or equal to about 0.009:1, less than or equal to about 0.008:1, less than or equal to about 0.007:1, less than or equal to about 0.006:1, or less than or equal to about 0.005:1. A mole ratio of the tellurium with respect to the zinc may be greater than or equal to about 0.0001:1, greater than or equal to about 0.0002:1, greater than or equal to about 0.0003:1, greater than or equal to about 0.0004:1, greater than or equal to about 0.0005:1, greater than or equal to about 0.0006:1, greater than or equal to about 0.0007:1, greater than or equal to about 0.0008:1, greater than or equal to about 0.0009:1, greater than or equal to about 0.001:1, greater than or equal to about 0.0011:1, greater than or equal to about 0.0012:1, greater than or equal to about 0.0013:1, greater than or equal to about 0.0014:1, or greater than or equal to about 0.0015:1. A molar amount of zinc (Zn) may be greater than that of selenium (Se).

A molar amount of zinc (Zn) may be greater than that of selenium (Se) and a molar amount of selenium may be greater than that of tellurium, for example, as measured by an ICP-AES analysis of the semiconductor nanocrystal particle.

In an embodiment, in the ICP-AES analysis, a mole ratio of Se to Zn may be less than about 1:1, for example, less than or equal to about 0.95:1, less than or equal to about 0.90:1, less than or equal to about 0.85:1, less than or equal to about 0.8:1, less than or equal to about 0.7:1, less than or equal to about 0.6:1, less than or equal to about 0.5:1, less than or equal to about 0.45:1, or less than or equal to about 0.4:1.

In an embodiment, (for example, in the ICP-AES analysis,) a mole ratio of Se to Zn may be greater than or equal to about 0.1:1, for example, greater than or equal to about 0.2:1, greater than or equal to about 0.3:1, greater than or equal to about 0.4:1, or greater than or equal to about 0.45:1.

In the quantum dot, a mole ratio of sulfur to Zn may be greater than or equal to about 0.1:1, for example, greater than or equal to about 0.15:1, greater than or equal to about 0.2:1, or greater than or equal to about 0.3:1, greater than or equal to about 0.4:1. In the quantum dot, the mole ratio of sulfur to Zn may be less than or equal to about 0.9:1, for example, less than or equal to about 0.8:1, less than or equal to about 0.7:1, less than or equal to about 0.6:1, less than or equal to about 0.5:1, or less than or equal to about 0.45:1.

In the quantum dot of an embodiment, a mole ratio of Se+S to zinc ((Se+S):Zn) may be less than or equal to about 0.9:1, less than or equal to about 0.89:1, less than or equal to about 0.88:1, less than or equal to about 0.87:1, less than or equal to about 0.86:1, less than or equal to about 0.85:1, or less than or equal to about 0.84. In the quantum dot of an embodiment, a mole ratio of Se+S to zinc ((Se+S):Zn) may be greater than or equal to about 0.3:1, greater than or equal to about 0.4:1, greater than or equal to about 0.5:1, greater than or equal to about 0.6:1, greater than or equal to about 0.7:1, or greater than or equal to about 0.8:1. In the semiconductor nanocrystal particle, a mole ratio of Se and S to zinc may be less than or equal to about 1:1.

In the quantum dot of an embodiment, a mole ratio of sulfur with respect to selenium may be less than or equal to about 2.4:1. In the quantum dot, a mole ratio of sulfur with respect to selenium may be less than or equal to about 2:1, less than or equal to about 1.95:1, less than or equal to about 1.9:1, less than or equal to about 1.85:1, less than or equal to about 1.80:1, less than or equal to about 1.40:1, less than or equal to about 1.25:1, less than or equal to about 1.19:1, less than or equal to about 0.95:1, less than or equal to about 0.80:1, less than or equal to about 0.75:1, less than or equal to about 0.7:1, or less than or equal to about 0.69:1. In a quantum dot of an embodiment, a mole ratio of sulfur with respect to selenium may be greater than or equal to about 0.4:1, greater than or equal to about 0.5:1, greater than or equal to about 0.6:1, greater than or equal to about 0.7:1, greater than or equal to about 0.95:1, greater than or equal to about 1:1, greater than or equal to about 1.1:1, greater than or equal to about 1.23:1, greater than or equal to about 1.25:1, greater than or equal to about 1.3:1, greater than or equal to about 1.4:1, or greater than or equal to about 1.95:1.

The quantum dot of an embodiment may emit blue light with improved quantum efficiency (e.g., of greater than or equal to about 70%, for example, greater than or equal to about 71%, greater than or equal to about 72%, greater than or equal to about 73%, greater than or equal to about 74%, or greater than or equal to about 75%) and a decreased FWHM (e.g., of less than about 30 nm, less than or equal to about 25 nm, or less than or equal to about 22 nm). The quantum dot may have a quantum efficiency of greater than or equal to about 80%, greater than or equal to about 85%, or greater than or equal to about 90%.

As used herein, the quantum efficiency may be a relative quantum yield or an absolute quantum yield that can be readily measured by any commercially available equipment. The quantum efficiency (or quantum yield) may be measured in a solution state or a solid state (in a composite). In an embodiment, "quantum yield (or quantum efficiency)" may be a ratio of photons emitted to photons absorbed, e.g., by a nanostructure or population of nanostructures. In an embodiment, the quantum efficiency may be determined by any method. For example, there may be two methods for measuring the fluorescence quantum yield or efficiency: the absolute method and the relative method. The absolute method directly obtains the quantum yield by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on their PL wavelengths, but are not limited thereto.

The QY may be readily and reproducibly determined by using commercially available equipment, for example, from Hitachi Co. Ltd or Hamamatsu Co. Ltd and referring to the instruction manuals provided from the manufacturer.

A maximum luminescent peak of the quantum dot of an embodiment may have (for example, measured at room temperature or about 25° C.) a full width at half maximum (FWHM) of less than or equal to about 25 nm. A FWHM of the maximum luminescent peak of the quantum dot of an embodiment may be less than about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, or less than or equal to about 13 nm.

A maximum luminescent peak of the quantum dot of an embodiment may have (for example, measured at 77K (−196° C.)) a full width at half maximum of less than or equal to about 25 nm. A FWHM of the maximum luminescent peak of the quantum dot of an embodiment may be (for example, measured at 77K) less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 10 nm, or less than or equal to about 9 nm.

It is believed that in an embodiment of a production process for making the quantum dot, crystal growth of the quantum dot may be controlled to predominantly grow along a desired crystal facet(s) and thus a resulting quantum dot may exhibit a reduced level of a lattice defect and crystallographycally improved qualities (e.g., reduced defects and/or well-defined facet). Without wishing to be bound by any theory, it is believed that such an improved crystalline quality may affect luminous properties of the quantum dot, and this can be confirmed by suppressed/inhibited surface trap emission. Trap emission is emission other than band edge emission (in other words, the emission relating to valance band and conduction band). The degree of or amount of trap emission can be determined by low temperature photoluminescent spectroscopy analysis (for example carried out at a temperature of about 77 K). In an embodiment, as determined in a low temperature photoluminescent analysis, the quantum dot may show an FWHM of less than or equal to about 11 nm, for example, less than or equal to about 10 nm, less than or equal to about 9 nm, or less than or equal to about 8 nm.

In an embodiment, the quantum dot may further include fluorine and optionally chlorine. The presence of the halogen in the quantum dot of the embodiment may be determined by using an appropriate analysis tool such as an X-ray photoelectron spectroscopy (XPS).

In an embodiment, in a time resolved photoluminescence (TRPL) analysis, the quantum dot may have an average decay time ($t_{avg}$) of greater than or equal to about 10 nanoseconds (ns), greater than or equal to about 15 ns, or greater than or equal to about 20 ns. In an embodiment, in a time resolved photoluminescence (TRPL) analysis, the quantum dot may have an average decay time ($t_{avg}$) of less than or equal to 40 ns, less than or equal to about 30 ns, or less than or equal to about 27 ns.

In an embodiment, in a time resolved photoluminescence (TRPL) analysis, the quantum dot may have a decay fraction of t1 (e.g., about 5 ns) that is greater than or equal to about 5%, greater than or equal to about 10%, greater than or equal to about 15%, greater than or equal to about 20%, or greater than or equal to about 25%. In an embodiment, in a time resolved photoluminescence (TRPL) analysis, the quantum dot may have a decay fraction of t1 (e.g., about 5 ns) that is from about 5% to about 40%, from about 10% to about 35%, from about 15% to about 30%, from about 20% to about 25%, or a combination thereof.

In an embodiment, the time resolved photoluminescence (TRPL) may be used to determine a temporal evolution and a corresponding radiative lifetime with respect to an emitted light of the quantum dot of the embodiment. An apparatus for the TRPL analysis is commercially available. The luminescence data may be fit with a multi-exponential decay of the form:

$$I(t) = \Sigma_{i=1}^{N} a_i e^{-t/\tau_i}$$

convolved with the instrument response function, where t is time, I(t) is an intensity at the time t, $\tau_i$ and $a_i$ correspond to the lifetime and the fractional contribution of each component to the decay, respectively.

In an embodiment, the quantum dots of the emission layer may be well fit by a three-term exponential composed of a fast initial decay (t1), followed by a moderate decay (t2), in addition to a longer lived component (t3), and the decay time at each component is denoted as t1, t2, and t3, respectively. An average decay time ($t_{avg}$) is a weighted average of the decay times of the components.

In an embodiment, in a time resolved photoluminescence (TRPL) analysis, the quantum dot may have a decay fraction of t2 (e.g., about 21 ns) that is greater than or equal to about 30%, greater than or equal to about 40%, greater than or equal to about 50%, or greater than or equal to about 60%. In an embodiment, in a time resolved photoluminescence (TRPL) analysis, the quantum dot may have a decay fraction of t2 (e.g., about 21 ns) that is less than or equal to about 80%.

In an embodiment, in a time resolved photoluminescence (TRPL) analysis, the quantum dot may have a decay fraction of t3 (e.g., about 56 ns) that is greater than or equal to about 5%, greater than or equal to about 6%, or greater than or equal to about 7%. In an embodiment, in a time resolved photoluminescence (TRPL) analysis, the quantum dot may have a decay fraction of t3 (e.g., about 56 ns) that is less than or equal to about 20%.

In an embodiment, a method of producing the quantum dot includes providing a core including a first semiconductor nanocrystal including a zinc chalcogenide; and reacting a zinc precursor, a selenium precursor, and a sulfur precursor in a reaction medium (e.g., including an organic solvent) in the presence of an organic ligand, a fluorine compound, and optionally a chlorine compound, to form the semiconductor nanocrystal on (e.g., directly on) a surface of the core. The formation of the shell may include the injection of a fluorine compound. An amount of the fluorine compound may be greater than or equal to about 0.1 mmol per 10 mL of a core solution having an optical density of about 0.54 at a first absorption peak wavelength.

In an embodiment, the core (or the zinc chalcogenide) may include zinc, selenium, and tellurium. In an embodiment, the core may be obtained by preparing a zinc precursor solution including a zinc precursor and an organic ligand; preparing a selenium precursor and a tellurium precursor; heating the zinc precursor solution in a reactor vessel to a first reaction temperature and adding the selenium precursor and the tellurium precursor to the vessel, optionally together with an organic ligand, to achieve a reaction between the added precursor components.

In the core including the first semiconductor nanocrystal, a mole ratio of tellurium with respect to selenium may be less than or equal to about 0.1:1, less than or equal to about 0.08:1, less than or equal to about 0.05:1. In order to form the core, an amount of the selenium precursor for forming the core may be greater than or equal to about 10 moles, for example, greater than or equal to about 12 moles, greater than or equal to about 15 moles, greater than or equal to about 20 moles, greater than or equal to about 25 moles, greater than or equal to about 26 moles, greater than or equal to about 27 moles, greater than or equal to about 28 moles, greater than or equal to about 29 moles, greater than or equal to about 30 moles, greater than or equal to about 31 moles, greater than or equal to about 32 moles, greater than or equal to about 33 moles, greater than or equal to about 34 moles, greater than or equal to about 35 moles, greater than or equal to about 36 moles, greater than or equal to about 37 moles, greater than or equal to about 38 moles, greater than or equal to about 39 moles, or greater than or equal to about 40 moles based on one mole of the tellurium precursor. The amount of the selenium precursor may be less than or equal to about 60 moles, less than or equal to about 59 moles, less than or equal to about 58 moles, less than or equal to about 57 moles, less than or equal to about 56 moles, or less than or equal to about 55 moles based on one mole of the tellurium precursor. Within the foregoing ranges of the selenium and the tellurium, the core having the aforementioned composition may be formed.

The formation of the semiconductor nanocrystal shell may include reacting the zinc precursor and the selenium precursor, and then reacting the zinc precursor and the sulfur precursor.

The fluorine compound may include a fluorine inorganic salt, hydrofluoric acid, or a combination thereof. The fluorine inorganic salt may include a metal fluoride. The method may further include further injecting a chlorine compound together with the fluorine compound. The chlorine compound may include hydrochloric acid, a metal chloride, or a combination thereof.

An amount of the fluorine compound may be greater than or equal to about 0.05 mmol, greater than or equal to about 0.1 mmol, greater than or equal to about 0.15 mmol, greater than or equal to about 0.2 mmol, greater than or equal to about 0.25 mmol, greater than or equal to about 0.3 mmol, greater than or equal to about 0.35 mmol, greater than or equal to about 0.4 mmol, greater than or equal to about 0.45 mmol, greater than or equal to about 0.5 mmol, greater than or equal to about 0.55 mmol, greater than or equal to about 0.6 mmol, greater than or equal to about 0.7 mmol, greater than or equal to about 0.75 mmol, greater than or equal to about 0.8 mmol, greater than or equal to about 0.85 mmol, greater than or equal to about 0.9 mmol, or greater than or equal to about 1 mmol, per 10 mL of a quantum dot core solution having a predetermined optical density (e.g., 0.54) at a first absorption wavelength. The amount of the fluorine compound may be, less than or equal to about 3 mmol, less than or equal to about 2.5 mmol, less than or equal to about 2 mmol, or less than or equal to about 1.5 mmol, per 10 mL of a quantum dot core solution having a predetermined optical density (e.g., 0.54).

An amount of the fluorine compound may be greater than or equal to about 1 times, greater than or equal to about 5 times, greater than or equal to about 10 times, greater than or equal to about 15 times, greater than or equal to about 20 times, greater than or equal to about 25 times, greater than or equal to about 30 times, greater than or equal to about 35 times, greater than or equal to about 40 times, greater than or equal to about 45 times, greater than or equal to about 50 times, greater than or equal to about 55 times, greater than or equal to about 60 times, greater than or equal to about 65 times, or greater than or equal to about 70 times of total moles of the core.

An amount of the fluorine compound may be, less than or equal to about 200 times, less than or equal to about 150 times, less than or equal to about 140 times, less than or equal to about 130 times, less than or equal to about 120 times, less than or equal to about 110 times, less than or equal to about 100 times, less than or equal to about 90 times, less than or equal to about 80 times, or less than or equal to about 70 times of total moles of the quantum dot core.

If used, an amount of the chlorine compound may be greater than or equal to about 0.01 mmol, for example, greater than or equal to about 0.02 mmol, greater than or equal to about 0.03 mmol, greater than or equal to about 0.04 mmol, greater than or equal to about 0.05 mmol, greater than or equal to about 0.06 mmol, greater than or equal to about 0.07 mmol, greater than or equal to about 0.08 mmol, greater than or equal to about 0.09 mmol, greater than or equal to about 0.1 mmol, greater than or equal to about 0.11 mmol, greater than or equal to about 0.12 mmol, greater than or equal to about 0.13 mmol, greater than or equal to about 0.14 mmol, or greater than or equal to about 0.15 mmol, per 10 mL of a quantum dot (e.g. core)_solution having an optical density 0.54 at a first absorption wavelength. When being used, an amount of the chlorine compound may be less than or equal to about 3 mmol, for example, less than or equal to about 2.5 mmol, less than or equal to about 2 mmol, or less than or equal to about 1.5 mmol, per 10 mL of a quantum dot solution having an optical density 0.54 at a first absorption wavelength. Without wishing to be bound by any theory, it is believed that during the formation of the shell, the presence of the halogen compound in the aforementioned range may induce crystal growth predominantly along a desired facet (e.g., a (100) facet), whereby the quantum dots of the embodiment may exhibit further improved crystal quality, further enhanced optical properties, and/or controlled shape parameters.

The zinc precursor may include a Zn powder, ZnO, an alkylated Zn compound (e.g., C2 to C30 dialkyl zinc such as diethyl zinc), a Zn alkoxide (e.g., a zinc ethoxide), a Zn carboxylate (e.g., a zinc acetate), a Zn nitrate, a Zn perchlorate, a Zn sulfate, a Zn acetylacetonate, a Zn halide (e.g., a zinc chloride), a Zn cyanide, a Zn hydroxide, zinc carbonate, zinc peroxide, or a combination thereof. Examples of the zinc precursor may include dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, or a combination thereof.

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

The tellurium precursor may include tellurium-trioctylphosphine (Te-TOP), tellurium-tributylphosphine (Te-TBP), tellurium-triphenylphosphine (Te-TPP), or a combination thereof, but is not limited thereto.

The sulfur precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), bis(trimethylsilyl) sulfur, ammonium sulfide, sodium sulfide, or a combination thereof.

The organic solvent may be a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl phosphine) substituted with at least one (e.g., 1, 2, or 3) C6 to C22 alkyl group, a primary, secondary, or tertiary phosphine oxide (e.g., trioctylphosphine oxide) substituted with a (e.g., 1, 2, or 3) C6 to C22 alkyl group(s), a C12 to C22 aromatic ether such as a phenyl ether or a benzyl ether, or a combination thereof.

The organic ligand may coordinate, e.g., be bound to, the surface of the produced nanocrystal and may have an effect on the light emitting and electric characteristics as well as may effectively disperse the nanocrystal in the solution phase. The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR, $RPO(OH)_2$, $R_2POOH$, wherein each R is the same or different and is each independently hydrogen, a substituted or unsubstituted C1 to C40 (or C3 to C24) aliphatic hydrocarbon group, a substituted or unsubstituted C6 to C40 (or C6 to C24) aromatic hydrocarbon group, or a combination thereof provided that at least one of the R is not hydrogen, or a combination thereof. One or more ligands may be used.

Examples of the organic ligand compound may include methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butane amine, pentane amine, hexane amine, octane amine, dodecane amine, hexadecyl amine, oleyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, palmitic acid, stearic acid; a phosphine such as methyl phosphine, ethyl phosphine, propyl phosphine, butyl phosphine, pentyl phosphine, tributylphosphine, or trioctylphosphine; a phosphine oxide such as methyl phosphine oxide, ethyl phosphine oxide, propyl phosphine oxide, butyl phosphine oxide, or trioctylphosphine oxide; a diphenyl phosphine or triphenyl phosphine compound, or an oxide compound thereof; phosphonic acid, or the like, but are not limited thereto. One or more organic ligand compounds may be used. In an embodiment, the organic ligand compound may be a combination of RCOOH and amine, e.g., $RNH_2$, $R_2NH$, and/or $R_3N$, wherein R is as defined above.

The first reaction temperature may be greater than or equal to about 280° C., for example, greater than or equal to about 290° C. A reaction time for forming the core is not particularly limited and may be appropriately selected. For example, the reaction time may be greater than or equal to about 5 minutes, greater than or equal to about 10 minutes, greater than or equal to about 15 minutes, greater than or equal to about 20 minutes, greater than or equal to about 25 minutes, greater than or equal to about 30 minutes, greater than or equal to about 35 minutes, greater than or equal to about 40 minutes, greater than or equal to about 45 minutes, or greater than or equal to about 50 minutes, but is not limited thereto. For example, the reaction time may be less than or equal to about 2 hours, but is not limited thereto. By controlling the reaction time, the size of the core may be controlled.

Reaction conditions for forming the shell may be selected appropriately in part based on a desired composition of the shell. In an embodiment, a solvent and optionally an organic ligand may be heated (and/or placed under vacuum) at a predetermined temperature (e.g., at a temperature of greater than or equal to about 100° C.). After a determined amount of time under vacuum, the reaction vessel is charged (filled) with an inert gas and then is heated at a predetermined temperature (e.g., at a temperature of greater than or equal to about 100° C.). Then, a core may be added, e.g., injected, and shell precursors may be added, e.g., injected sequentially or simultaneously and a resulting mixture is heated to a predetermined reaction temperature to carry out a reaction. The fluorine compound (and optionally the chlorine compound) may be added, e.g., injected during shell formation.

A mixture having different ratios of the shell precursors may be sequentially added for a given period of time, e.g., a reaction time, to achieve a desired composition of the quantum dot or to form a gradient or a multi-layered shell on the core. In an embodiment, a first shell layer may be formed by reacting a zinc precursor and a selenium precursor and then a second shell layer may be formed by reacting a zinc precursor and a sulfur precursor. A reaction temperature for forming the first or the second shell layer may be greater than or equal to about 320° C., greater than or equal to about 330° C., or greater than or equal to about 340° C. A reaction temperature for forming the first or the second shell layer may be less than or equal to about 380° C., less than or equal to about 370° C., less than or equal to about 360° C., or less than or equal to about 350° C.

The fluorine compound (and optionally the chlorine compound) may be added, e.g., injected during the shell formation (e.g., in case of the formation of the multi-layered shell, during the formation of the first shell layer, after the formation of the first shell layer and prior to the second shell layer, during the second shell layer, after the second shell layer, or a combination thereof).

In a reaction system, an amount and a concentration of the precursors may be selected considering the compositions of the core and the shell layers and the reactivity between the precursors.

After the completion of the reaction, a non-solvent is added to reaction products and the nanocrystal particles coordinated with, e.g., bound to, the ligand compound may be separated. The non-solvent may be a polar solvent that is miscible with the solvent used in the core formation and/or shell formation reactions and is not capable of dispersing the produced nanocrystals therein. The non-solvent may be selected depending on the solvent used in the reaction and may be, for example, acetone, ethanol, butanol, isopropanol, water, tetrahydrofuran (THF), dimethylsulfoxide (DMSO), diethylether, formaldehyde, acetaldehyde, ethylene glycol, a solvent having a similar solubility parameter to the foregoing non-solvents, or a combination thereof. Separation of the nanocrystal particles may involve centrifugation, sedimentation, chromatography, or distillation. The separated nanocrystal particles may be added to a washing solvent and washed, if desired. The washing solvent is not particularly limited and a solvent having similar solubility parameter to that of the ligand may be used and examples thereof may include hexane, heptane, octane, chloroform, toluene, benzene, or the like.

The quantum dots of the embodiment may not be dispersible in water, any of the foregoing listed non-solvent, or a mixture thereof. The quantum dots of the embodiment may be water-insoluble.

The quantum dots of the embodiments following separation from the reaction solvent and reaction components may be dispersed in an aforementioned organic solvent. In some embodiments, the quantum dots may be dispersed in a C6 to C40 aliphatic hydrocarbon, a C6 to C40 aromatic hydrocarbon, or a mixture thereof.

In another embodiment, an electronic device includes the quantum dots described herein. The device may include a display device, a light emitting diode (LED), an organic light emitting diode (OLED), a quantum dot LED, a sensor, a solar cell, an imaging sensor, or a liquid crystal display, but is not limited thereto.

In an embodiment, the electronic device may be a photoluminescent device (e.g., a lighting device such as a quantum dot sheet or a quantum dot rail, a liquid crystal display (LCD), etc.) or an electroluminescent device (e.g., QD LED).

In another non-limiting embodiment, the electronic device may include a quantum dot sheet and the aforementioned semiconductor nanocrystal particles may be included in a quantum dot sheet, e.g., in a form of a semiconductor nanocrystal-polymer composite, at times referred to as a quantum dot composite.

In another non-limiting embodiment, the electronic device may include a quantum dot sheet and the aforementioned quantum dots may be included in a quantum dot sheet (e.g., in a form of a semiconductor nanocrystal-polymer composite).

Figure 2:
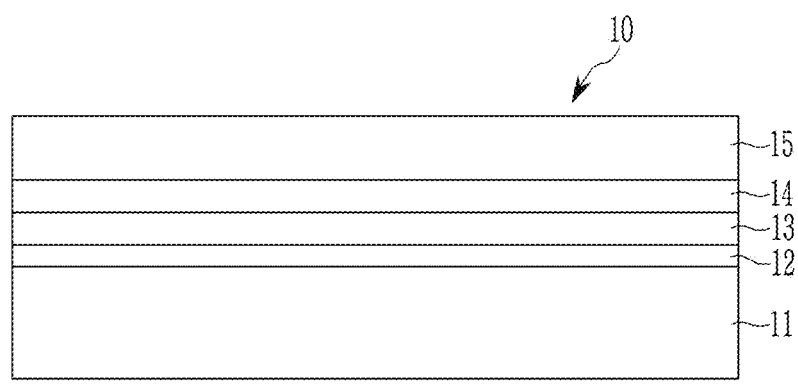
FIG. 2 is cross-sectional view of a QD LED device according to non-limiting embodiments.

In a non-limiting embodiment, the electronic device may be an electroluminescent device. Referring to FIG. 2, the electronic device 10 may include an anode 11 and a cathode 15 each having a surface opposite the other and quantum dot emission layer 13 disposed between the anode and the cathode and including a plurality of quantum dots, wherein the plurality of quantum dots may include the aforementioned quantum dots.

The electronic device may include charge (hole or electron) auxiliary layers between the anode and the cathode. For example, the electronic device may include a hole auxiliary layer 12 between the first electrode (anode) 11 and the quantum dot emission layer 13 and/or an electron auxiliary layer 14 between the second electrode (cathode) 15 and the quantum dot emission layer 13.

The light emitting device may further include a substrate. The substrate (not shown) may be disposed at the side of the first electrode 11 or the second electrode 15. In an embodiment, the substrate may be disposed at an opposite surface of the first electrode. The substrate may include an insulating material (e.g., insulating transparent substrate). The substrate may include glass; a polymer such as a polyester (e.g., polyethylene terephthalate (PET), polyethylene naphthalate (PEN)), a polycarbonate, a polyacrylate, a polyimide, a poly(amide-imide), a polysiloxane (e.g. PDMS), or a combination thereof; an inorganic material such as $Al_2O_3$, ZnO, or a combination thereof; or a combination comprising a least two of the foregoing, but is not limited thereto.

The substrate may be made of a silicon wafer. As used herein, the term "transparent" refers to having a transmittance of greater than or equal to about 85% of light having a predetermined wavelength (e.g., light emitted from a quantum dot), or for example, transmittance of greater than or equal to about 88%, greater than or equal to about 90%, greater than or equal to about 95%, greater than or equal to about 97%, or greater than or equal to about 99%, e.g., about 85% to about 99.99%, or about 90% to about 99.9%. A thickness of the substrate may be appropriately selected considering a substrate material but is not particularly limited. The transparent substrate may be flexible. The substrate may be omitted.

One of the first electrode 11 or the second electrode 15 may be an anode and the other may be a cathode. For example, the first electrode 11 may be an anode and the second electrode 15 may be a cathode.

The first electrode 11 may be made of an electrically conductive material, for example a metal, a conductive metal oxide, or a combination thereof. The first electrode 11 may include, for example, a metal or an alloy thereof, the metal including nickel, platinum, vanadium, chromium, copper, zinc, and gold; a conductive metal oxide such as zinc oxide, indium oxide, tin oxide, indium tin oxide (ITO), indium zinc oxide (IZO), or fluorine doped tin oxide; or a combination of metal and a metal oxide such as ZnO and Al or $SnO_2$ and Sb, but is not limited thereto. A combination comprising at least two of the foregoing may also be used. In an embodiment, the first electrode may include a transparent conductive metal oxide, for example, indium tin oxide. A work function of the first electrode may be greater than a work function of the second electrode. Alternatively, a work function of the first electrode may be less than a work function of the second electrode.

The second electrode 15 may be made of a conductive material, for example a metal, a conductive metal oxide, a conductive polymer, or a combination thereof. The second electrode 15 may include, for example, a metal or an alloy thereof, such as aluminum, magnesium, calcium, sodium, potassium, titanium, indium, yttrium, lithium, gadolinium silver, gold, platinum, tin, lead, cesium, or barium; a multi-layer structured material such as LiF/Al, $Li_2O$/Al, 8-hydroxyquinolinolato-lithium/aluminum (Liq/Al), LiF/Ca, or $BaF_2$/Ca, but is not limited thereto. A combination comprising at least two of the foregoing may also be used. The conductive metal oxide is the same as described above.

In an embodiment, a work function of the first electrode 11 and a work function of the second electrode 15 are not particularly limited and selected appropriately.

At least one of the first electrode 11 and the second electrode 15 may be a light-transmitting electrode and the light-transmitting electrode may be for example made of a conductive oxide such as a zinc oxide, an indium oxide, a tin oxide, an indium tin oxide (ITO), an indium zinc oxide (IZO), a fluorine doped tin oxide, a metal thin layer including a single layer or a multilayer, or a combination thereof. In case where any of the first electrode 11 and the second electrode 15 is a non-light-transmitting (e.g., non-transparent) electrode, it may include, for example, an opaque conductive material such as aluminum (Al), silver (Ag), gold (Au), or a combination thereof.

A thickness of the electrodes (the first electrode and/or the second electrode) is not particularly limited and may be appropriately selected with consideration of the device efficiency. For example, the thickness of the electrodes may be greater than or equal to about 5 nanometers (nm), for example, greater than or equal to about 50 nm, or greater than or equal to about 1 μm. For example, the thickness of the electrodes may be less than or equal to about 100 micrometers (μm), for example, less than or equal to about 10 μm, less than or equal to about 1 μm, less than or equal to about 900 nm, less than or equal to about 500 nm, or less than or equal to about 100 nm.

The emission layer 13 includes (e.g., a plurality of) quantum dot(s). The quantum dots may include the aforementioned quantum dot. The emission layer may include at least one monolayer of the quantum dots. The emission layer 13 may include at least one monolayer (e.g., at least two monolayers, at least three monolayers, at least four monolayers) of the quantum dot. The number of the monolayers of the quantum dots may be less than or equal to about 20, less than or equal to about 10, less than or equal to about 9, less than or equal to about 8, less than or equal to about 7, or less than or equal to about 6. The emission layer 13 may have a thickness of greater than or equal to about 5 nm, for example, greater than or equal to about 10 nm, greater than or equal to about 20 nm, or greater than or equal to about 30 nm and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The emission layer 13 may have for example a thickness of about 10 nm to about 150 nm, for example about 20 nm to about 100 nm or about 30 nm to about 50 nm.

The light emitting device of an embodiment may further include a hole auxiliary layer. In a non-limiting embodiment, the hole auxiliary layer 12 may be disposed between the first electrode 11 and the emission layer 13. The hole auxiliary layer 12 may have one layer or two or more layers, and may include, for example, a hole injection layer (HIL), a hole transport layer (HTL), an electron blocking layer, or a combination thereof.

The hole auxiliary layer 12 may have a HOMO energy level that may match a HOMO energy level of the emission layer 13 and may facilitate mobility of holes from the hole auxiliary layer 12 into the emission layer 13. In an embodiment, the hole auxiliary layer 12 may include a hole injection layer proximate to the first electrode 11 and a hole transport layer proximate to the emission layer 13.

A material included in the hole auxiliary layer 12 (for example, a hole transporting layer or a hole injection layer) is not particularly limited and may include, for example, poly(9,9-dioctyl-fluorene-co-N-(4-butylphenyl)-diphenylamine) (TFB), polyarylamine, poly(N-vinylcarbazole), poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), m-MTDATA (4,4',4"-tris[phenyl (m-tolyl)amino]triphenylamine), 4,4',4"-tris(N-carbazolyl)-triphenylamine (TCTA), 1,1-bis[(di-4-tolylamino) phenylcyclohexane (TAPC), a p-type metal oxide (e.g., NiO, $WO_3$, $MoO_3$, etc.), a carbon-based material such as graphene oxide, or a combination thereof, but is not limited thereto.

The electron blocking layer (EBL) may include, for example, poly(3,4-ethylenedioxythiophene):poly(styrene sulfonate) (PE DOT: PSS), poly(9,9-dioctyl-fluorene-co-N-(4-butylphenyl)-diphenylamine) (TFB) polyarylamine, poly (N-vinylcarbazole), polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), m-MTDATA, 4,4',4"-tris(N-carbazolyl)-triphenylamine (TCTA), or a combination thereof, but is not limited thereto.

In the hole auxiliary layer(s), a thickness of each layer may be appropriately selected depending on the desired characteristics of each layer. For example, the thickness of each layer may be greater than or equal to about 5 nm, greater than or equal to about 10 nm, greater than or equal to about 15 nm, greater than or equal to about 20 nm and less than or equal to about 100 nm, for example, less than or equal to about 90 nm, less than or equal to about 80 nm, less than or equal to about 70 nm, less than or equal to about 60 nm, less than or equal to about 50 nm, less than or equal to about 40 nm, less than or equal to about 35 nm, or less than or equal to about 30 nm, but is not limited thereto.

In an embodiment, the electron auxiliary layer 14 may be disposed between the emission layer 13 and the second electrode 15. The electron auxiliary layer 14 may include, for example, an electron injection layer (EIL) facilitating the injection of the electrons, an electron transport layer (ETL) facilitating the transport of the electrons, a hole blocking layer (HBL) blocking the hole movement, or a combination thereof, but is not limited thereto.

In an embodiment, the EIL may be disposed between the ETL and the cathode. In an embodiment, the HBL may be disposed between the ETL (or the EIL) and the emissive layer, but is not limited thereto. In an embodiment, a thickness of each layer may be selected appropriately and may be greater than or equal to about 1 nm and less than or equal to about 500 nm, but is not limited thereto. The EIL may be an organic layer (e.g., prepared by vapor deposition). The ETL may include an inorganic oxide nanoparticle, an organic layer (e.g., prepared by vapor deposition), or a combination thereof.

The electron transport layer, the electron injection layer, or a combination thereof may include, for example, 1,4,5, 8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, ET204 (8-(4-(4,6-di(naphthalen-2-yl)-1,3,5-triazin-2-yl) phenyl)quinolone), 8-hydroxyquinolinato lithium (Liq), an n-type metal oxide (e.g., ZnO, $HfO_2$, etc.), or a combination thereof, but is not limited thereto.

The hole blocking layer (HBL) may include, for example, 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, or a combination thereof, but is not limited thereto.

In an embodiment, the electron auxiliary layer 14 may include an electron transport layer. The ETL may include a plurality of nanoparticles.

The nanoparticles include a metal oxide including zinc.

The metal oxide may include zinc oxide, zinc magnesium oxide, or a combination thereof. The metal oxide may include $Zn_{1-x}M_xO$ (wherein M is Mg, Ca, Zr, W, Li, Ti, Y, Al, or a combination thereof and $0 \le x \le 0.5$). In an embodiment, the M may be magnesium (Mg). In an embodiment, x may be greater than or equal to about 0.01 and less than or equal to about 0.3, for example, less than or equal to about 0.25, less than or equal to about 0.2, or less than or equal to about 0.15.

An absolute value of LUMO of quantum dots included in the emission layer may be smaller than an absolute value of LUMO of the metal oxide. In an embodiment, an absolute value of LUMO of quantum dots may be larger than an absolute value of LUMO of a metal oxide ETL. An average size of the nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm. The nanoparticles may not have a rod shape. The nanoparticles may not have a nano wire shape.

In an embodiment, the thickness of the electron auxiliary layer 14 (e.g., the thickness of each of an electron injection layer, an electron transport layer, or a hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

Figure 3:
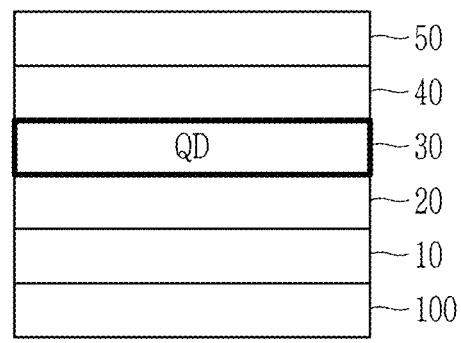
FIG. 3 is a schematic cross-sectional view of a QD LED device according to non-limiting embodiments.

In a device according to an embodiment, an anode 10 disposed on a transparent substrate 100 may include a metal oxide-based transparent electrode (e.g., ITO electrode) and a cathode 50 facing the anode may include a metal (Mg, Al, etc.) of a relatively low work function. For example, a hole auxiliary layer 20, for example, a hole transport layer including TFB, poly(9-vinylcarbazole) (PVK), or a combination thereof; a hole injection layer including PEDOT:PSS, a p-type metal oxide, or a combination thereof; or a combination thereof may be disposed between the transparent electrode 10 and the emission layer 30. An electron auxiliary layer 40 such as an electron injection layer/transport layer may be disposed between the quantum dot emission layer 30 and the cathode 50. (see FIG. 3) A device according to an embodiment has an inverted structure.

Figure 4:
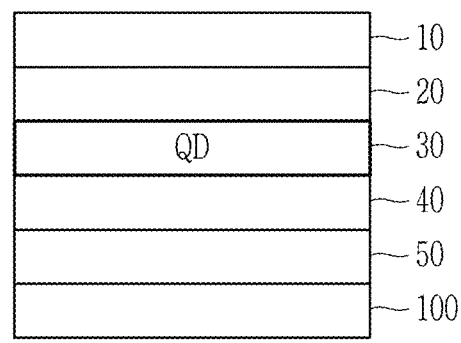
FIG. 4 is a schematic cross-sectional view of a QD LED device according to non-limiting embodiments.

Herein, the cathode 50 disposed on a transparent substrate 100 may include a metal oxide-based transparent electrode (e.g., ITO) and the anode 10 facing the cathode may include a metal (e.g., Au, Ag, etc.) of a relatively high work function. For example, an n-type metal oxide (ZnO) may be disposed between the transparent electrode 50 and the emission layer 30 as an electron auxiliary layer 40 (e.g., an electron transport layer (ETL)). A hole auxiliary layer 20 (e.g., a hole transport layer (HTL) including TFB, PVK, or a combination thereof a hole injection layer (HIL) including $MoO_3$ or another p-type metal oxide, or a combination thereof) may be disposed between the metal anode 10 and the quantum dot emission layer 30. (see FIG. 4)

The device of the embodiment may be prepared in an appropriate manner. In an embodiment, the electroluminescent device may be prepared by forming a charge (e.g., hole) auxiliary layer on a substrate having an electrode thereon (e.g., via deposition or coating), forming an emissive layer including the quantum dots (e.g., a pattern of the aforementioned quantum dots) thereon (e.g., via deposition or coating), and forming an electrode (optionally together with a charge (e.g., electron) auxiliary layer) thereon (e.g., via deposition or coating). The formation of the electrode/hole auxiliary layer/electron auxiliary layer is not particularly limited and may be selected appropriately.

The device according to an embodiment may have a maximum external quantum efficiency (Max EQE) of greater than or equal to about 7%, for example, greater than or equal to about 7.5%, or greater than or equal to about 7.7%. The device according to an embodiment may have a T50 of greater than or equal to about 20 hours, 21 hours, greater than or equal to about 22 hours, greater than or equal to about 23 hours, greater than or equal to about 24 hours, or greater than or equal to about 25 hours.

The device according to an embodiment may emit blue light. The blue light have a maximum peak wavelength of greater than or equal to about 440 nm, greater than or equal to about 445 nm, greater than or equal to about 448 nm, greater than or equal to about 450 nm, greater than or equal to about 452 nm, and less than or equal to about 480 nm, less than or equal to about 475 nm, less than or equal to about 470 nm, less than or equal to about 460 nm, less than or equal to about 458 nm, or less than or equal to about 455 nm. The luminescent peak of the blue light may have an FWHM of less than or equal to about 21 nm, for example, less than or equal to about 20 nm, less than or equal to about 19 nm, less than or equal to about 18 nm, or less than or equal to about 17 nm.

Hereinafter, specific examples are presented. However, these examples are exemplary, and the present disclosure is not limited thereto.

Analysis Methods

[1] Photoluminescence Analysis and Measurement of Absolute QY (1) Photoluminescence (PL) spectra of the produced nanocrystals are measured at room temperature or a low temperature of 77K using a Hitachi F-7000 spectrometer and an irradiation wavelength of 372 nm.

(2) An absolute quantum yield can be measured by using a Quantaurus-QY measurement equipment (Quantaurus-QY Absolute PL quantum yield spectrophotometer C11347-11) from Hamamatsu Co., Ltd, a multi-channel detector according to the instruction manual of the manufacturer.

[3] Transmission Electron Microscopy (TEM) Analysis

Transmission electron microscopy photographs of nanocrystals quantum dots are obtained using an UT F30 Tecnai electron microscope.

[4] High Resolution (HR) TEM, Fast Fourier Transform (FFT) and Electron Diffraction (ED) Analysis (1) HR-TEM analysis is made using TEM-Titan G2

(2) an FFT is made for the obtained HR-TEM image (3) an Electron Diffraction analysis is made for the obtained HR-TEM image.

[4] ICP Analysis

An inductively coupled plasma-atomic emission spectroscopy (ICP-AES) is performed using Shimadzu ICPS-8100.

[4] TGA Analysis

The thermogravimetric analysis of the quantum dots is performed using a thermogravimetric analyzer (TA Q5000 (Q5000IR) manufactured by TA Instruments).

[5] X-ray Diffraction

An XRD analysis is made by using Philips XPert PRO With respect to the obtained spectrum, Origin program (from Originlab Korea Co., Ltd.) is used to carry out a peak deconvolution analysis and an area ratio between the given peaks is calculated.

[6] Electroluminescence Spectroscopy

For a light emitting device as obtained, evaluation of electroluminescent properties thereof is made by using a Keithley 2200 source measurement equipment and a Minolta CS2000 spectroradiometer (current-voltage-luminance measurement equipment). The current, luminance, electroluminescence (EL) depending upon a voltage applied to the device are measured by the current-voltage-luminance measurement, and thereby an external quantum efficiency is also calculated.

[7] Life Span Analysis

T50(h): the elapsed time measured from the initial luminance (100%) to a reduction by 50% (being operated at 325 nit).

T95(h): the elapsed time measured from the initial luminance (100%) to a reduction by 5% (being operated at 325 nit).

Synthesis of Quantum Dots is performed under an inert gas atmosphere (nitrogen flowing condition) unless particularly mentioned.

Example 1: (HF70)

(1) Selenium, sulfur, and tellurium are dispersed in trioctylphosphine (TOP) to obtain a 2 molar (M) Se/TOP stock solution, a 1M S/TOP stock solution, and a 0.1 M Te/TOP stock solution, respectively. Hydrofluoric acid (HF) is dissolved in acetone to prepare a HF acetone solution.

4.5 millimoles (mmol) of zinc acetate along with oleic acid is dissolved in trioctylamine in a 250 milliliter (mL) reaction flask, and heated to 120° C. under vacuum. After 1 hour, the reactor is filled with an inert gas.

The reaction solution is heated to 300° C., the Se/TOP stock solution and the Te/TOP stock solution produced above are rapidly injected into the flask at a ratio of Te:Se=1:30, or a Te:Se mole ratio of 0.033:1. After the completion of the reaction, the obtained reaction solution is cooled to room temperature, ethanol is added, and the resulting mixture is centrifuged to obtain a precipitate. The precipitate is dispersed in toluene to obtain a toluene dispersion of ZnSeTe core. An average size of the nanocrystal core is about 3 nm.

Trioctylamine (TOA) is put in a 300 mL reaction flask, zinc acetate and oleic acid are added to the flask, and the obtained mixture is treated under vacuum at 120° C. The atmosphere inside of the flask is replaced with nitrogen ($N_2$), and the flask is heated to 340° C. and the toluene dispersion of the ZnSeTe core (OD at $1^{st}$ absorption peak: 0.54, volume: 10 mL) is rapidly added to the flask. The Se/TOP stock solution and the S/TOP stock solution are then added sequentially to provide a shell layer including Zn, Se, and S (hereinafter, a shell formation reaction) on the core. During the shell formation reaction, a solution including 1.05 mmol of HF is injected.

A mole ratio among the used amounts of a Zn precursor, a Se precursor, and a S precursor is 4:1.5:2.8. A total reaction time is about 180 minutes. A total amount of HF is about 1.05 mmol (7 times the amount used in Example 2 below).

Example 2: (HF10)

The quantum dots are prepared in the same manner as set forth in Example 1 with the exception that the amount of the HF is 0.15 mmol.

Comparative Example 1: (HF0)

The quantum dots are prepared in the same manner as set forth in Example 1 with the exception of not using HF.

Experimental Example 1

[1] Room Temperature and Low Temperature (77K) PL Spectroscopy Analysis

For the quantum dots prepared in Example 1, Example 2, and Comparative Example 1, room temperature- and low temperature-PL spectroscopy analysis are conducted using a quantum dot dispersion (solvent: hexane) and the results are summarized in Table 1.

TABLE 1

| | PL peak wavelength (nm) | Absolute. QY (%) | Rm. Temp. FWHM (nm) | Low Temp. FWHM (nm) |
| --- | --- | --- | --- | --- |
| Example 1 (HF70) | 450 | 93 | 14 | 8 |
| Example 2 (HF10) | 442 | 63 | 14 | 9 |
| Comp. Example 1 (HF0) | 447 | 25 | 14 | 11 |

The results indicate that the quantum dots of Example 1 and Example 2 show improved optical properties (e.g., a significant increase in quantum yield, QY) in comparison to the quantum dots of Comparative Example 1. Moreover, the results of the Low temperature PL spectrum analysis confirm that the quantum dot of Example 1 and Example 2 show a reduced low temp. FWHM in comparison with the quantum dots of Comparative Example 1, indicating the increase of band edge emission and the decrease in the trap emission for the quantum dots of Examples 1 and 2.

[2] ICP Analysis

For the quantum dots of Example 1, Example 2 and Comparative Example 1, an ICP-AES analysis is conducted and the results are shown in Table 2.

TABLE 2

| | (S + Se)/Zn | S:Se | Te/Se |
| --- | --- | --- | --- |
| Comparative Example 1 (HF0) | 0.90 | 0.71:1 | 0.0018 |
| Example 2 (HF10) | 0.90 | 0.72:1 | 0.0019 |
| Example 1 (HF70) | 0.83 | 0.68:1 | 0.002 |

[3] XRD Analysis

For the quantum dots prepared in Example 1, Example 2, and Comparative Example 1, an X ray diffraction analysis is carried out to obtain X-Ray Diffraction spectrums. The results are shown in FIG. 5.

Figure 5:
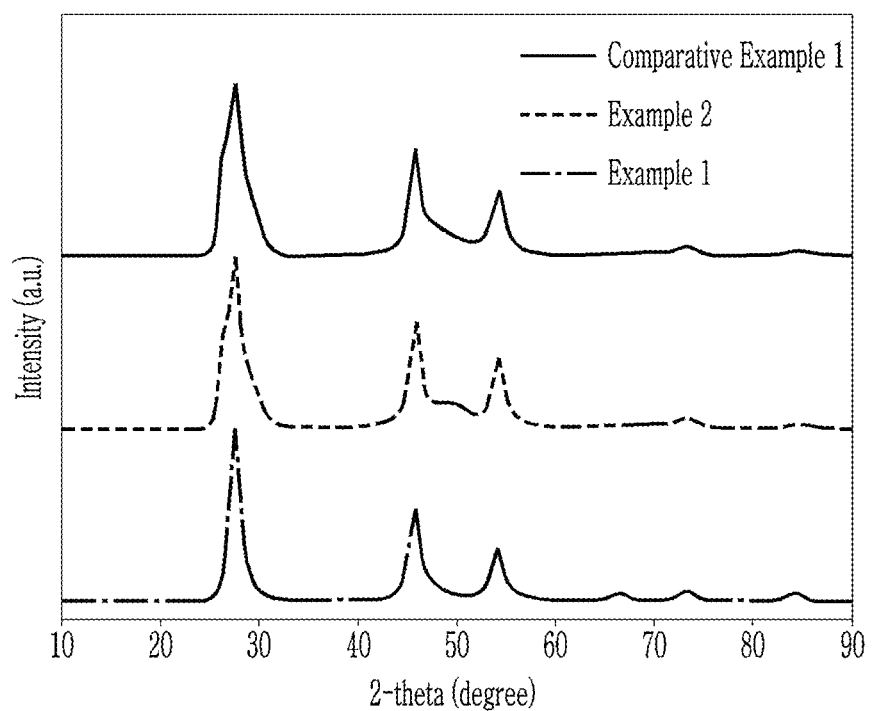
FIG. 5 is a view showing the result of an X-ray diffraction spectroscopy analysis for the quantum dots prepared by Example 1 (HF70), Example 2 (HF10), and Comparative Example 1 (HF0).

The results of FIG. 5 confirm that in the X-ray diffraction spectroscopy analysis, the quantum dots of Example 1 and Example 2 do show significantly reduced defect peaks or substantially no defect peaks (i.e., peaks other than zinc blende (ZB) crystal) in comparison to the quantum dots of Comparative Example 1.

A peak deconvolution is carried out for the obtained X-ray diffraction spectrum to separate the peaks assigned to the zinc blende (ZB) crystal structure from the peaks of the crystal defects and the area ratio of each is calculated. The results are shown in Table 3.

TABLE 3

| | ZB crystal | Crystal Defect (e.g. wurtzite) | Defect/ZB |
| --- | --- | --- | --- |
| Comparative Example 1 (HF0) | 55% | 45% | 0.82 |
| Example 2 (HF10) | 75% | 25% | 0.33 |
| Example 1 (HF70) | 99% | 1% | 0.01 |

The results of Table 3 confirm that the amount of crystal defect is significantly lower in the quantum dots of Example 1 and Example 2 than in the quantum dots of Comparative Example 1.

[4] Transmission Electron Microscopy Analysis

Figure 6A:
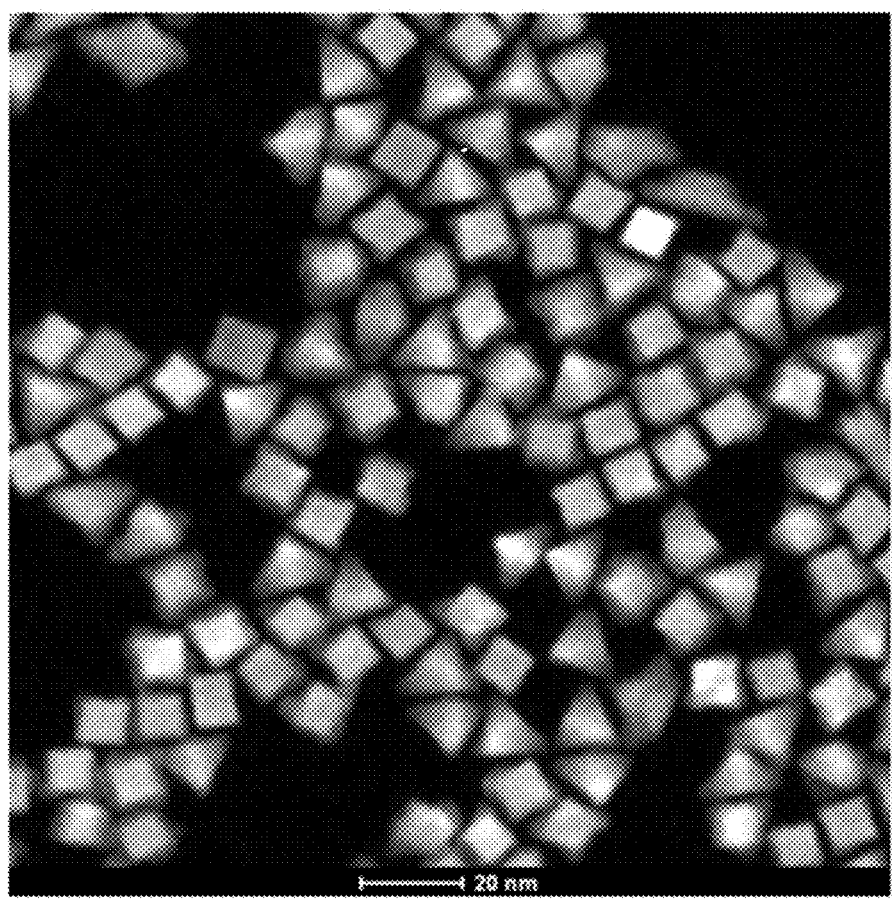
FIG. 6A and FIG. 6B is a view showing the result of a transmission electron microscopy analysis for the quantum dots prepared by Example 1 (HF70) and Comparative Example 1 (HF0).
Figure 6B:
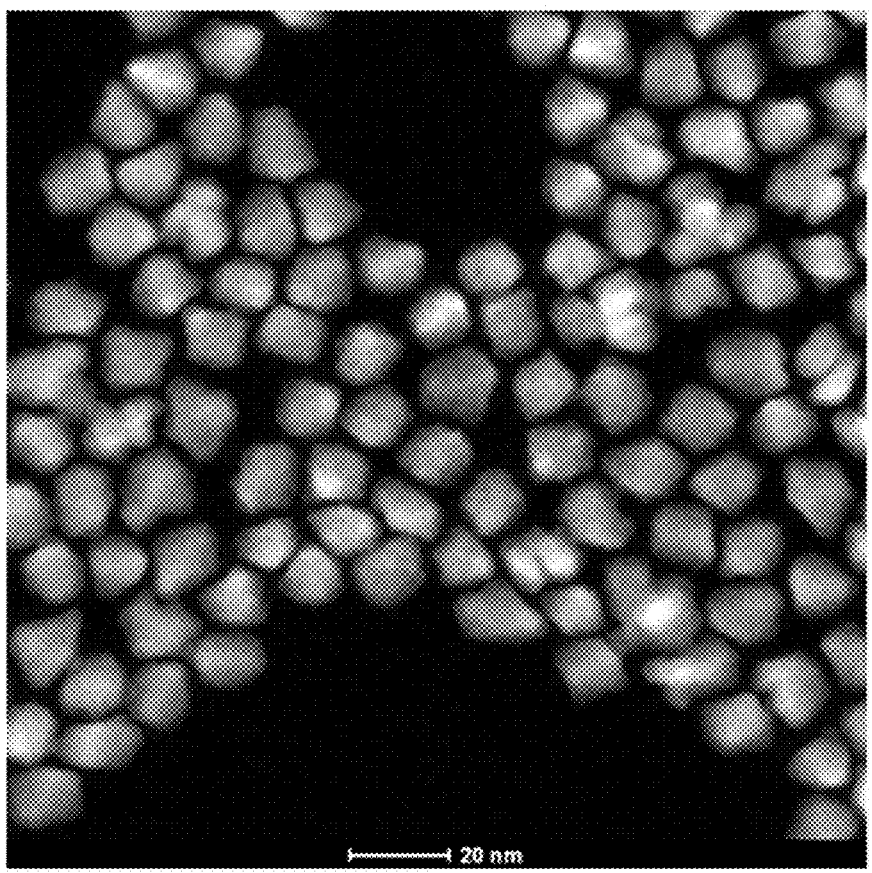

For the quantum dots of Example 1, Example 2, and Comparative Example 1, transmission electron microscopy analysis are carried out and results are shown in FIG. 6A and FIG. 6B. Using an Image J program, an average particle size, circularity, and solidity (as described herein) are calculated and the results are summarized in Table 4.

TABLE 4

| | Average Size | Solidity | Circularity |
| --- | --- | --- | --- |
| Comparative Example 1 (HF0) | 12 nm | 0.94 | 0.80 |
| Example 2 (HF10) | 12 nm | 0.94 | 0.78 |
| Example 1 (HF70) | 12 nm | 0.96 | 0.75 |

As indicated in the results of FIG. 6A, FIG. 6B, and Table 4, the quantum dots of Examples 1 and 2 exhibit a different shape parameter and more of a uniform cubic shape than those of Comparative Example 1. A circularity of 1 being near spherical.

Figure 7A:
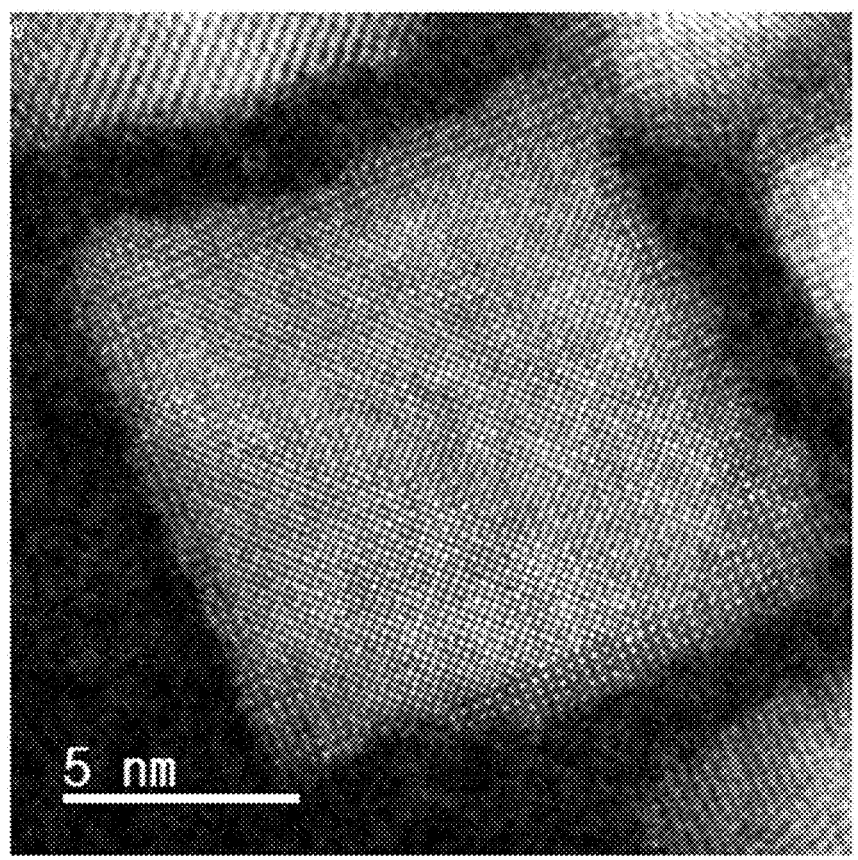
FIG. 7A and FIG. 7B are images of a high resolution transmission electron microscopy analysis for the quantum dots prepared by Example 1 (HF70) and Comparative Example 1 (HF0), respectively.
Figure 7B:
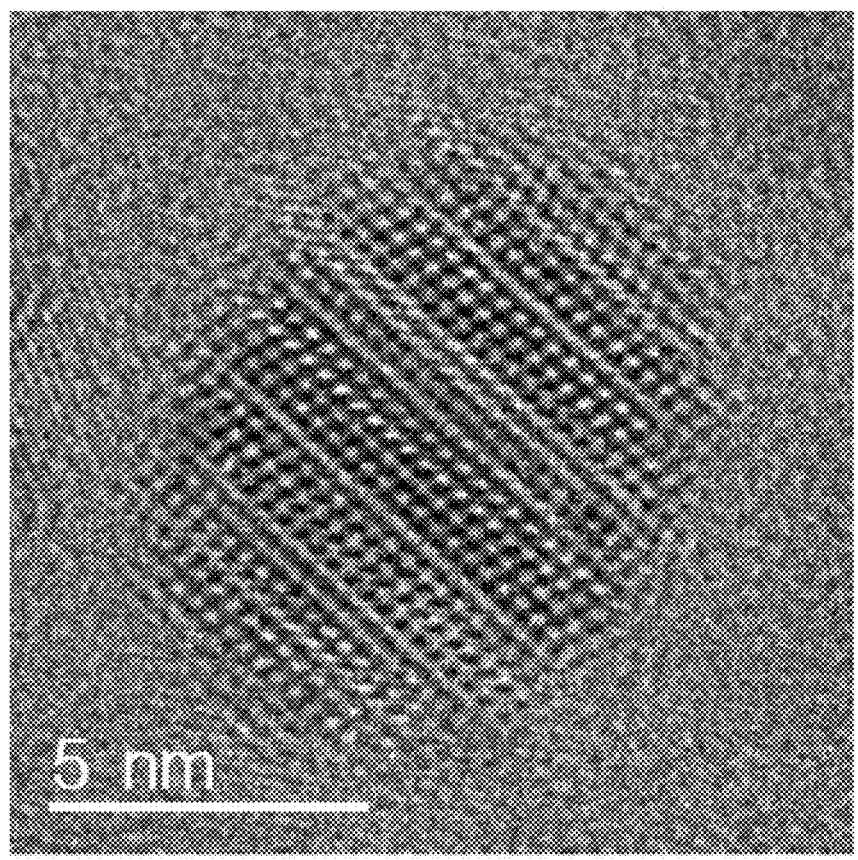
Figure 8A:
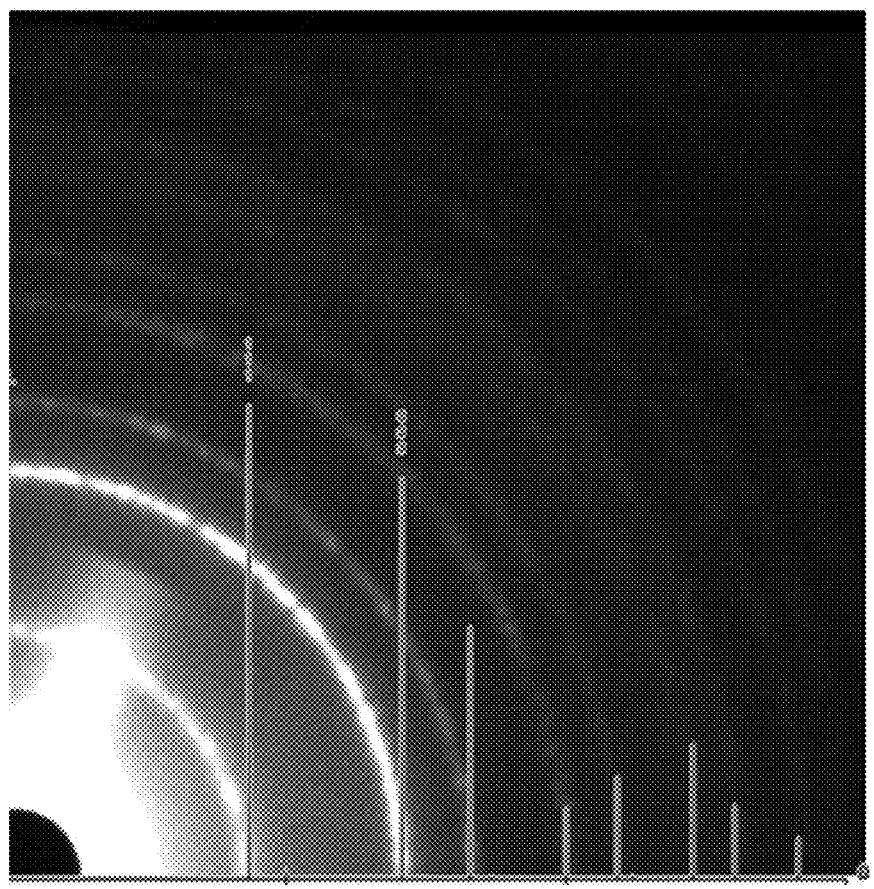
FIG. 8A and FIG. 8B are views showing electron diffraction patterns of the quantum dots prepared by Example 1 (HF70) and Comparative Example 1 (HF0), respectively.
Figure 8B:
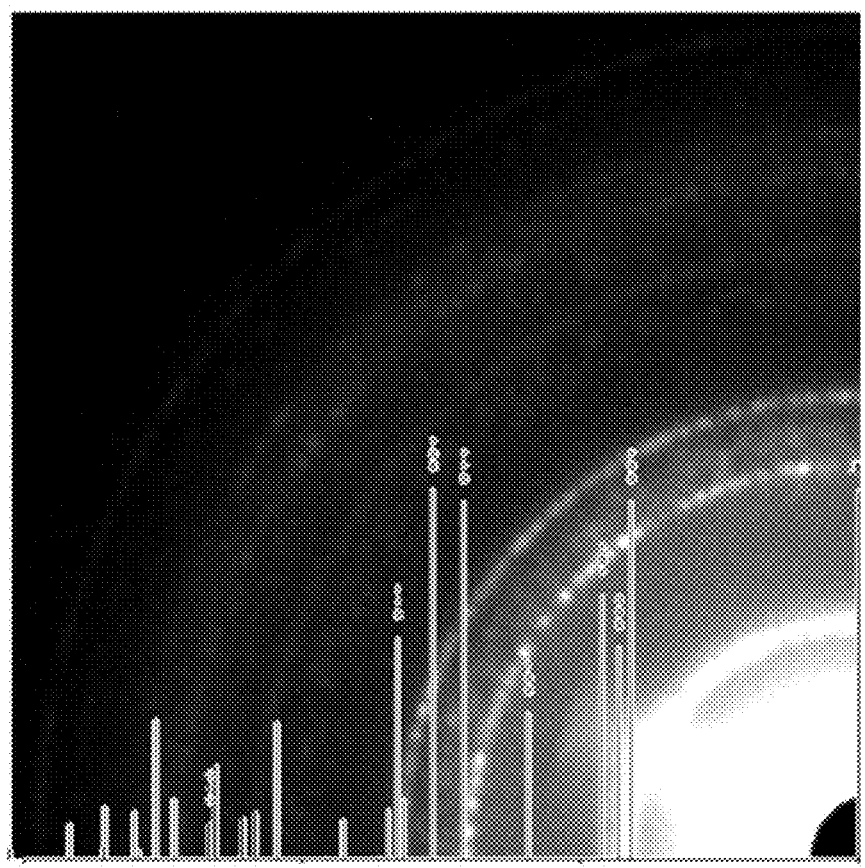

[5] High Resolution Transmission Electron Microscopic Analysis, Fast Fourier Transform, Electron Diffraction For the quantum dots of Example 1 and Comparative Example 1, the HR TEM analysis is carried out and the results are shown in FIG. 7A (Example 1) and FIG. 7B (Comparative Example 1).

Figure 9A:
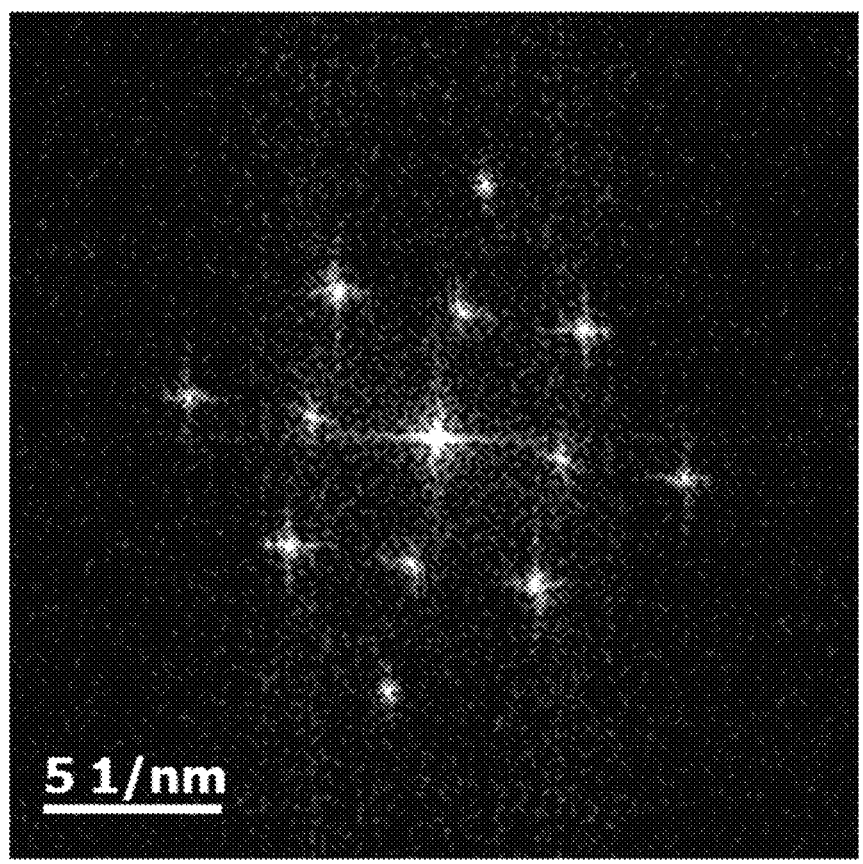
FIG. 9A and FIG. 9B are views showing digital diffraction patterns obtained by a fast Fourier transform of a high resolution transmission electron microscopy image for the quantum dots prepared by Example 1 (HF70) and Comparative Example 1 (HF0), respectively.
Figure 9B:
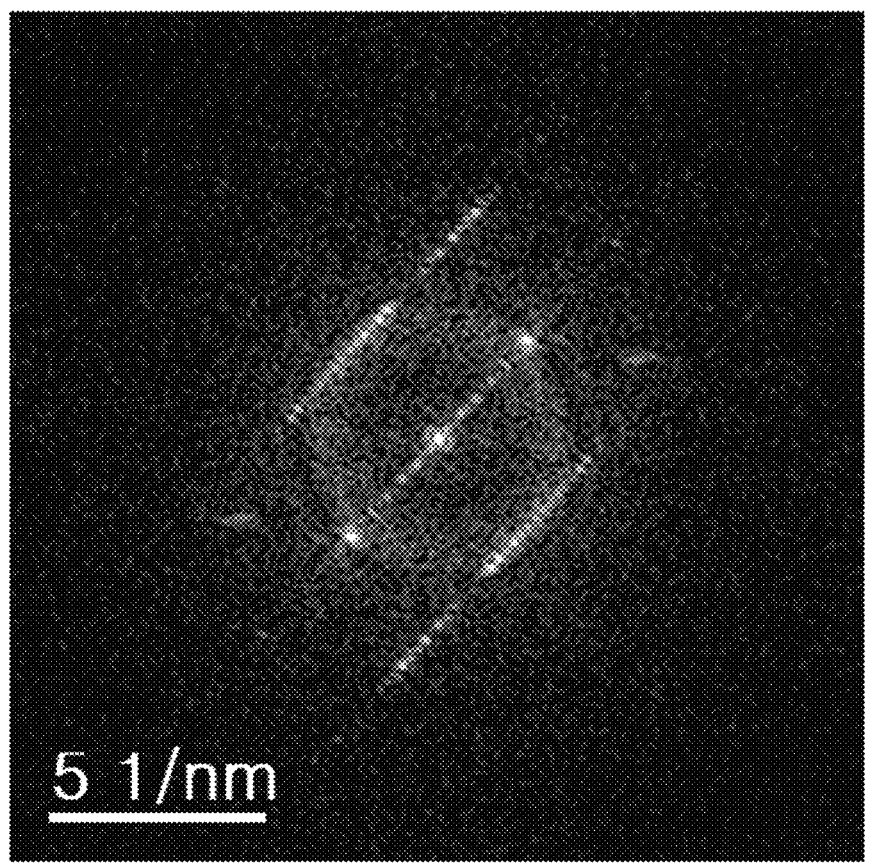

The results confirm that in the quantum dots of Example 1, the atomic arrangement of the crystal is more regular whereas in the quantum dots of Comparative Example 1, many stacking faults are present in the atomic arrangement of the crystal. Moreover, from using the Fast Fourier Transform for the HR TEM image, a diffraction pattern is obtained and the results are shown in FIG. 9A (Example 1) and FIG. 9B (Comparative Example 1). For the quantum dots of Example 1 and Comparative Example 1, an electron diffraction analysis is made to obtain a diffraction pattern and the results are shown in Table 8A (Example 1) and Table 8B (Comparative Example 1).

The results of the electron diffraction and the Fast Fourier Transform of the HR TEM image confirm that the quantum dots of Example 1 do not substantially show diffuse scattering, and thus, possess excellent crystallinity. The results indicate that during the preparation of the quantum dots of Example 1, an epitaxy crystal growth at a (100) facet predominates with minimal presence lattice defect, and the surface of the quantum dot predominantly includes (or consists of) a (100) facet. In contrast, the electron diffraction pattern and the FFT-TEM pattern of the quantum dots of Comparative Example 1 include considerable diffuse scattering, indicating that there are many crystal defects, and that during production many different crystal facets grow simultaneously resulting in quantum dots that include many lattice defects.

[6] TRPL Analysis

Using fluorescence lifetime spectrometer ("picoquant fluotime 300" by PicoQuant Co. Ltd.), a TRPL analysis is made for the quantum dots of Example 1, Example 2, and Comparative Example 1. The results are shown in the following table.

TABLE 5

|  | Comparative Example 1 | Example 2 | Example 1 |
| --- | --- | --- | --- |
| t1 (5 ns) fraction | 74% | 10% | 16% |
| t2 (21 ns) fraction | 25% | 73% | 76% |
| t3 (56 ns) fraction | 1% | 16% | 8% |
| $t_{avg}$ | 9.5 ns | 26.1 ns | 21.7 ns |

Example 3: (HF70+ZnCl$_2$))

Zinc chloride is dissolved in ethanol to prepare a chloride solution.

Quantum dots are prepared in the same manner as set forth in Example 1 except that the chloride solution is further injected during the shell formation reaction (injected amount of the chloride: 0.09 mmol).

Example 4: (HF40+ZnCl$_2$)

Quantum dots are prepared in the same manner as set forth in Example 1 except that the amount of the hydrofluoric acid is 0.6 mmol and the chloride solution is further injected during the shell formation reaction (injected amount of the chloride: 0.09 mmol).

Comparative Example 2

Quantum dots are prepared in the same manner as set forth in Example 1 except that the hydrofluoric acid is not used and the chloride solution is further injected during the shell formation reaction (injected amount of the chloride: 0.09 mmol).

Experimental Example 2

[1] Room Temperature and Low Temperature PL Spectroscopy Analysis

Figure 10A:
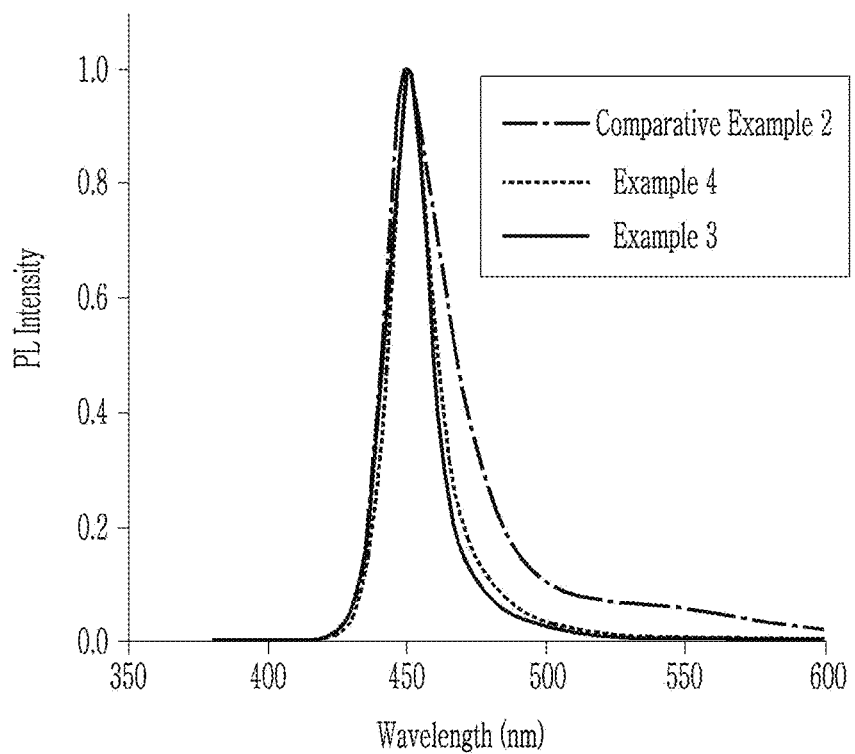
FIG. 10A is a room temperature photoluminescent spectrum of the quantum dots of Example 3, Example 4, and Comparative Example 2.
Figure 10B:
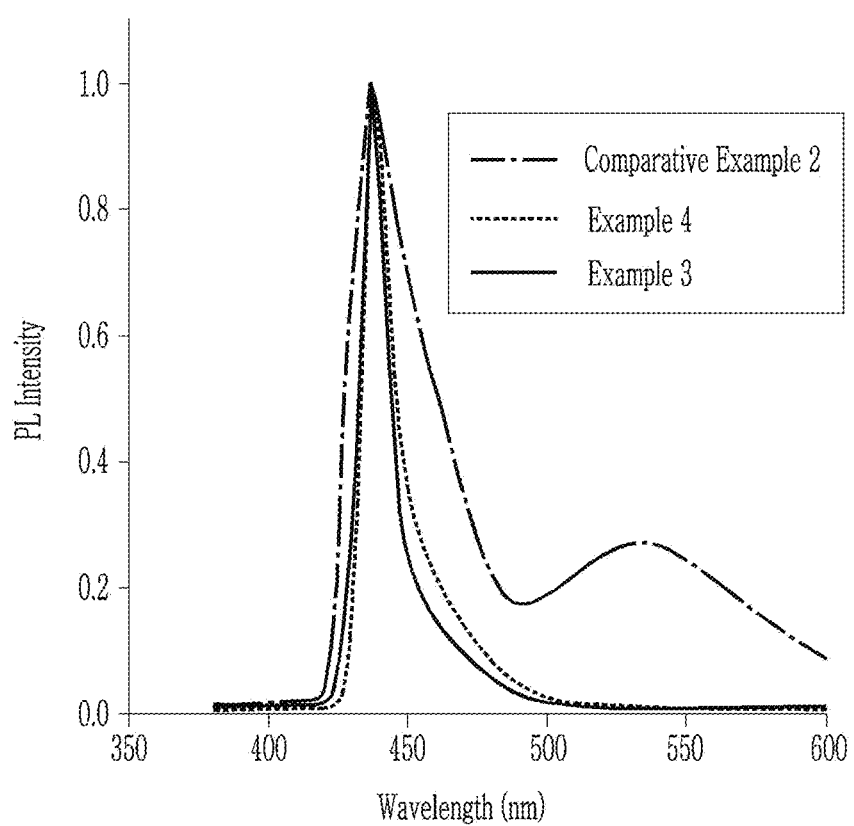
FIG. 10B is a low temperature (at 77K) photoluminescent spectrum of the quantum dots of Example 3, Example 4, and Comparative Example 2.

For the quantum dots prepared in Example 3, Example 4, and Comparative Example 2, room temperature- and low temperature-PL spectroscopy analysis are conducted and the results are summarized in Table 5 and FIGS. 10A and 10B.

TABLE 6

|  | PL (nm) | Absolute QY (%) | FWHM at room temp, (nm) | FWHM at low temp, (nm) |
| --- | --- | --- | --- | --- |
| Comparative Example 2 | 450 | 78 (including trap emission) | 29 | 34 |
| Example 3 | 452 | 86 | 17 | 10 |
| Example 4 | 452 | 88 | 17 | 12 |

The results indicate that the quantum dots of Example 3 and Example 4 show improved optical properties (e.g., QY and FWHM) in comparison with the quantum dots of Comparative Example 2 (CE2). For example, in both instances, FWHM is reduced by nearly 50%.

[2] XRD Analysis

For the quantum dots prepared in Example 3 and Example 4, an X ray diffraction analysis is carried out to obtain X-Ray Diffraction spectrums.

A peak deconvolution is carried out for the obtained X-ray diffraction spectrum to separate the peaks assigned to the zinc blende (ZB) crystal structure from the peaks of the crystal defect and the area ratio of each is calculated. The results confirm that the quantum dots of Example 3 and Example 4 show a defect peak ratio of less than or equal to about 0.1.

Production of Electroluminescent Device

Example 5

An electroluminescent device is manufactured by using the quantum dot of Example 1:

A poly(3,4-ethylenedioxythiophene): poly(styrenesulfonate) (PEDOT:PSS) layer and a poly(9,9-dioctyl-fluorene-co-N-(4-butylphenyl)-diphenylamine) (TFB) layer are spin-coated to respectively form a hole injection layer HIL (about 30 nm) and a hole transport layer (HTL) (about 25 nm) on a glass substrate deposited with an indium tin oxide (ITO) electrode (an anode).

On the TFB layer as prepared, a quantum dot emission layer (about 25 nm) is formed by spin-coating an octane dispersion of the quantum dot. On the quantum dot emission layer, a film based on crystalline zinc oxide nanoparticles (thickness: about 40 nm) is formed as the electron transport layer, and then, an Al electrode is deposited thereon.

Electroluminescent properties and lifetime properties of the device thus prepared are measured and the results are shown in Table 7.

Comparative Example 3

An electroluminescent device is prepared in the same manner as set forth in Example 5 except that instead of the quantum dots of Example 1, the quantum dots of Comparative Example 1 are used. Electroluminescent properties and lifetime properties of the device thus prepared are measured and the results are shown in Table 7.

TABLE 7

|  | EQE (max) | Luminance Max (cd/m$^2$) | T50 (hr) | FWHM (nm) |
| --- | --- | --- | --- | --- |
| Example 5 | 8% | 29500 | 32.7 | 17 |
| Comparative Example 3 | 7% | 23900 | 24.1 | 21 |

The results of Table 7 confirm that the electroluminescent device including the quantum dots of Example 1 may exhibit improved electroluminescent properties in comparison with those of the device including the quantum dots of Comparative Example 1.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. Quantum dots comprising zinc, tellurium, selenium, and sulfur,
   wherein in the quantum dots, a mole ratio of tellurium to selenium is greater than or equal to about 0.0001:1 and less than or equal to about 0.1:1, a mole ratio of selenium to zinc is greater than or equal to about 0.1:1 and less than about 1:1, and a mole ratio of sulfur to selenium is less than about 1.4:1,
   wherein the quantum dots do not comprise cadmium, and are configured to emit blue light,
   wherein the quantum dots are configured to exhibit an absolute quantum yield of greater than or equal to 71%.

2. The quantum dots of claim 1, wherein the quantum dots further comprise a halogen, or the quantum dots have an average of greater than or equal to about 0.9.

3. The quantum dots of claim 2, wherein the halogen comprises fluorine, and optionally chlorine.

4. The quantum dots of claim 1, wherein in an X-ray diffraction spectrum of the quantum dots, a ratio of a defect peak area with respect to a peak area of a zinc blende crystal structure is less than about 0.8:1.

5. The quantum dots of claim 1, wherein a maximum luminescent peak wavelength of the quantum dot is greater than or equal to about 430 nanometers and less than or equal to about 480 nanometers, or
   wherein a maximum luminescent peak of the quantum dot has a full width at half maximum of less than or equal to about 25 nanometers.

6. The quantum dots of claim 1, wherein in the quantum dot, a mole ratio of sulfur relative to selenium (S:Se) is less than or equal to about 0.8:1.

7. The quantum dot of claim 1, wherein in the quantum dot, a mole ratio of a sum of selenium and sulfur (S+Se) relative to zinc is less than or equal to about 0.86:1.

8. The quantum dots of claim 1, wherein in the quantum dot, a mole ratio of (Se+S) to zinc is less than or equal to 0.85:1.

9. The quantum dots of claim 1, wherein the average solidity is greater than about 0.94.

10. The quantum dots of claim 1, wherein the quantum dots are configured to exhibit an absolute quantum yield of greater than or equal to about 80%.

11. The quantum dots of claim 1, wherein an average particle size of the quantum dots is less than or equal to about 18 nm.

12. An electroluminescent device comprising:
   a first electrode with a surface, and a second electrode with a surface that faces the surface of the first electrode, and
   a quantum dot emission layer disposed between the first electrode and the second electrode and comprising the quantum dots of claim 1.

13. The electroluminescent device of claim 12, wherein the electroluminescent device further comprises a charge auxiliary layer between the first electrode and the quantum dot emission layer, between the second electrode and the quantum dot emission layer, or between the first electrode and the quantum dot emission layer and between the second electrode and the quantum dot emission layer.

14. The electroluminescent device of claim 12, wherein the electroluminescent device has an external quantum efficiency of greater than or equal to about 7.5% and a T50 of greater than or equal to about 25 hours, wherein the T50 is an elapsed time measured from an initial luminance to a reduction by 50%, being operated at 325 nit.

15. A display device comprising the electroluminescent device of claim 12.

16. An electronic device comprising the quantum dots of claim 1.

17. The electronic device of claim 16, wherein the electronic device is a display device, a light emitting diode (LED), an organic light emitting diode (OLED), a quantum dot LED, a sensor, a solar cell, an imaging sensor, or a liquid crystal display.

18. An electroluminescent device comprising:
   a first electrode with a surface, and a second electrode with a surface that faces the surface of the first electrode, and
   a quantum dot emission layer disposed between the first electrode and the second electrode and comprising quantum dots comprising zinc, tellurium, selenium, and sulfur,
   wherein in the quantum dots, a mole ratio of tellurium to selenium is greater than or equal to about 0.0001:1 and less than or equal to about 0.1:1, a mole ratio of selenium to zinc is greater than or equal to about 0.1:1 and less than about 1:1, and a mole ratio of sulfur to selenium is less than about 1.4:1,
   wherein the quantum dots do not comprise cadmium, and are configured to emit blue light, and
   wherein the quantum dots are configured to exhibit an absolute quantum yield of greater than or equal to 71%.

19. The electroluminescent device of claim 18, wherein the quantum dots further comprise a halogen.

\* \* \* \* \*